(12) United States Patent
Park et al.

(10) Patent No.: US 7,521,742 B2
(45) Date of Patent: Apr. 21, 2009

(54) COMPLEMENTARY METAL OXIDE SEMICONDUCTOR (CMOS) IMAGE SENSOR

(75) Inventors: Jung-ho Park, Seoul (KR); Tae-seok Oh, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 95 days.

(21) Appl. No.: 11/561,657

(22) Filed: Nov. 20, 2006

(65) Prior Publication Data

US 2008/0035957 A1 Feb. 14, 2008

(30) Foreign Application Priority Data

Jun. 5, 2006 (KR) .................... 10-2006-0050436

(51) Int. Cl.
*H01L 31/062* (2006.01)
(52) U.S. Cl. ..................... 257/291; 257/292
(58) Field of Classification Search ............. 257/291, 257/292, 506; 438/57
See application file for complete search history.

(56) References Cited

U.S. PATENT DOCUMENTS 7,037,748 B2 * 5/2006 Han ........................ 438/73

2005/0087783 A1 * 4/2005 Jang ........................ 257/292

FOREIGN PATENT DOCUMENTS

| KR | 2002-0057282 | 7/2002 |
| KR | 2003-0060601 | 7/2003 |
| KR | 1020040008914 | 1/2004 |
| KR | 1020050030341 | 3/2005 |
| KR | 10-0494030 | 6/2005 |
| KR | 10-2005-0069443 | 7/2005 |
| KR | 10-0558528 | 3/2006 |

OTHER PUBLICATIONS

Notice of Examination Report from Korean Intellectual Property issued on Apr. 24, 2007.

* cited by examiner

*Primary Examiner*—Mark Prenty
(74) *Attorney, Agent, or Firm*—F. Chau & Associates, LLC

(57) ABSTRACT

An improved complementary metal oxide semiconductor (CMOS) image sensor which may decrease the occurrence of dark current is provided. The CMOS image sensor includes a plurality of isolation regions formed in a substrate and a first impurity-doped region formed between the isolation region and separated from a side surface of the isolation region by a predetermined interval.

15 Claims, 16 Drawing Sheets

COMPLEMENTARY METAL OXIDE SEMICONDUCTOR (CMOS) IMAGE SENSOR

CROSS-REFERENCE TO RELATED APPLICATION

This application claims priority from Korean Patent Application No. 10-2006-0050436 filed on Jun. 5, 2006, the disclosure of which is hereby incorporated by reference herein in its entirety.

BACKGROUND OF THE INVENTION
1. Technical Field

The present disclosure relates to a complementary metal oxide semiconductor (CMOS) image sensor and a method of manufacturing the same and, more particularly, to a CMOS image sensor in which the doping profile of a floating diffusion region is modified to reduce dark current, and a method of manufacturing the same.

2. Description of the Related Art

There are variety of factors which may degrade the performance of a CMOS image sensor. For example, one such factor is known as dark current. Dark current may exert a significant influence on the imaging functions of a CMOS image sensor, such as for example, on a global shutter principle for simultaneously exposing all pixels. Moreover, a dark current may also cause what is known as a white point, by which a certain pixel appears white due to over-current, thereby degrading the quality of a resultant image.

A dark current may be generated, for example, by current generated in a P/N junction, by electric charges generated in a silicon interface or a surface dangling bond, or by electrons generated due to the state of an STI interface being an isolation layer. Furthermore, as the degree of integration of a CMOS image sensor increases, the dark current generated by shallow trench isolation (STI) interface defects or stress may become a significant difficulty. Also, as the dark current serves as over-current, the reliability of the device may be deteriorated.

Thus, there is a need for an improved CMOS image sensor which decreases dark current and to a method of forming the same.

SUMMARY OF THE INVENTION

Exemplary embodiments of the present invention may decrease dark current, which is generated at the interface between a floating diffusion region and an STI region and on the surface of the floating diffusion region.

In accordance with an exemplary embodiment of the present invention, a complementary metal oxide semiconductor (CMOS) image sensor is provided. The CMOS image sensor includes a plurality of isolation regions formed in a substrate and a first impurity-doped region formed between the isolation regions and separated from the side surface of the isolation region by a predetermined interval.

The interval between the isolation regions may correspond to a floating diffusion region, and the predetermined interval may correspond to a substrate dose region.

The CMOS image sensor may further include an upper impurity-doped region formed between the surface of the substrate and the first impurity-doped region. The upper impurity-doped region may be formed to adjoin the surface of the substrate and the side surface of the isolation region.

The upper impurity-doped region may be formed such that it adjoins the surface of the substrate and is separated from the side surface of the isolation region.

The first impurity-doped region may be an N-type impurity-doped region doped to a first dose, and the upper impurity-doped region may be an N-type impurity-doped region doped to a second dose which is no greater than about half of the first dose or a P-type impurity-doped region.

The CMOS image sensor may further include a corner impurity-doped region formed between the isolation region and the upper impurity-doped region. The corner impurity-doped region may be formed to adjoin the surface of the substrate, the side surface of the isolation region, and the side surface of the upper impurity-doped region.

The first impurity-doped region may be an N-type impurity-doped region doped to a first dose, and the corner impurity-doped region may be an N-type impurity-doped region doped to a second dose which is no greater than about half of the first dose, or a P-type impurity-doped region.

The CMOS image sensor may further include a second impurity-doped region formed between the first impurity-doped region and the isolation region. The second impurity-doped region may be formed to adjoin the surface of the substrate, the side surface of the isolation region, and the side surface of the first impurity-doped region.

The first impurity-doped region may be an N-type impurity-doped region doped to a first dose, and the second impurity-doped region may be an N-type impurity-doped region doped to a second dose which is no greater than about half of the first dose or a P-type impurity-doped region.

In accordance with an exemplary embodiment of the present invention, a complementary metal oxide semiconductor (CMOS) image sensor is provided. The CMOS image sensor includes a plurality of isolation regions formed in a substrate, a flank impurity-doped region formed to adjoin a side surface of the isolation region and a first impurity-doped region formed to adjoin a side surface of the flank impurity-doped region and opposite to the isolation region.

The interval between the isolation regions may correspond to a floating diffusion region.

The first impurity-doped region may be an N-type impurity-doped region doped to a first dose, and the flank impurity-doped region may be an N-type impurity-doped region doped to a second dose which is no greater than about half of the first dose, or a P-type impurity-doped region.

The flank impurity-doped region and the first impurity-doped region may be formed to adjoin the side surface of the substrate.

The CMOS image sensor may further include an upper impurity-doped region formed between the surface of the substrate and the first impurity-doped region.

The first impurity-doped region may be an N-type impurity-doped region doped to a first dose, and the upper impurity-doped region may be an N-type impurity-doped region doped to a second dose which is no greater than about half of the first dose, or a P-type impurity-doped region.

The lower end of the upper impurity-doped region and the upper end of the flank impurity-doped region may adjoin each other, and the side surface of the upper impurity-doped region and the side surface of the flank impurity-doped region may adjoin each other.

The CMOS image sensor may further include a corner impurity-doped region formed to adjoin the surface of the substrate between the upper impurity-doped region and the isolation region.

The first impurity-doped region may be an N-type impurity-doped region doped to a first dose, and the corner impurity-doped region may be an N-type impurity-doped region doped to a second dose which is no greater than about half of the first dose, or a P-type impurity-doped region.

The corner impurity-doped region may be formed to adjoin the surface of the substrate, the side surface of the isolation region, the upper surface of the flank impurity-doped region, and the side surface of the upper impurity-doped region.

In accordance with an exemplary embodiment of the present invention, a complementary metal oxide semiconductor (CMOS) image sensor is provided. The CMOS image sensor includes a plurality of isolation regions formed in a substrate, a first impurity-doped region formed to adjoin the side surface of the isolation region and an upper impurity-doped region formed between the surface of the substrate and the first impurity-doped region.

The interval between the isolation regions may correspond to a floating diffusion region.

The first impurity-doped region may be an N-type impurity-doped region doped to a first dose, and the upper impurity-doped region may be an N-type impurity-doped region doped to a second dose which is no greater than about half of the first dose, or a P-type impurity-doped region.

The first impurity-doped region may be formed to adjoin the surface of the substrate, and the upper impurity-doped region may be formed to adjoin the side surface of the isolation region.

The CMOS image sensor may further include a corner impurity-doped region formed to adjoin the surface of the substrate, the side surface of the upper impurity-doped region and the side surface of the isolation region.

The first impurity-doped region may be an N-type impurity-doped region doped to a first dose, and the corner impurity-doped region may be an N-type impurity-doped region doped to a second dose which is no greater than about half of the first dose, or a P-type impurity-doped region.

The lower end of the corner impurity-doped region may adjoin the first impurity-doped region.

In accordance with an exemplary embodiment of the present invention, a method of manufacturing a complementary metal oxide semiconductor (CMOS) image sensor is provided. The method includes forming a plurality of isolation regions in a substrate and forming a first impurity-doped region between the isolation regions such that the first impurity-doped region is separated from a side surface of the isolation region by a predetermined interval.

The interval between the isolation regions corresponds to a floating diffusion region, and the predetermined interval may correspond to a substrate dose region.

The method may further include forming an upper impurity-doped region between the surface of the substrate and the first impurity-doped region. The upper impurity-doped region may be formed to adjoin the surface of the substrate and the side surface of the isolation region.

The upper impurity-doped region may be formed such that it adjoins the surface of the substrate and is separated from the side surface of the isolation region.

The first impurity-doped region may be formed by doping an N-type impurity to a first dose, and the upper impurity-doped region may be formed by doping an N-type impurity to a second dose which is no greater than about half of the first dose, or by doping a P-type impurity.

A corner impurity-doped region may further be formed between the isolation region and the upper impurity-doped region.

The corner impurity-doped region may be formed to adjoin the surface of the substrate, the side surface of the isolation region, and the side surface of the upper impurity-doped region.

The first impurity-doped region may be formed by doping an N-type impurity to a first dose, and the corner impurity-doped region may be formed by doping an N-type impurity to a second dose which is no greater than about half of the first dose, or by doping a P-type impurity.

A second impurity-doped region may further be formed between the first impurity-doped region and the isolation region.

The second impurity-doped region may be formed to adjoin the surface of the substrate, the side surface of the isolation region, and the side surface of the first impurity-doped region.

The first impurity-doped region may be formed by doping an N-type impurity to a first dose, and the second impurity-doped region may be formed by doping an N-type impurity to a second dose which is no greater than about half of the first dose, or by doping a P-type impurity.

In accordance with an exemplary embodiment of the present invention, a method of manufacturing a complementary metal oxide semiconductor (CMOS) image sensor is provided. The method includes forming a plurality of isolation regions in a substrate, forming a flank impurity-doped region adjoining the side surface of the isolation region and forming a first impurity-doped region adjoining a side surface of the flank impurity-doped region and opposite to the isolation region.

The interval between the isolation regions may correspond to a floating diffusion region.

The first impurity-doped region may be formed by doping an N-type impurity to a first dose, and the flank impurity-doped region may be formed by doping an N-type impurity to a second dose which is no greater than about half of the first dose, or by doping a P-type impurity.

The flank impurity-doped region may be formed to adjoin the side surface of the substrate, and the first impurity-doped region may be formed to adjoin the side surface of the substrate.

An upper impurity-doped region may further be formed between the surface of the substrate and the first impurity-doped region.

The first impurity-doped region may be formed by doping an N-type impurity to a first dose, and the upper impurity-doped region may be formed by doping an N-type impurity to a second dose which is no greater than about half of the first dose, or by doping a P-type impurity.

The lower end of the upper impurity-doped region and the upper end of the flank impurity-doped region may adjoin each other, and the side surface of the upper impurity-doped region and the side surface of the flank impurity-doped region may adjoin each other.

A corner impurity-doped region may further be formed to adjoin the surface of the substrate between the upper impurity-doped region and the isolation region.

The first impurity-doped region may be formed by doping an N-type impurity to a first dose, and the corner impurity-doped region may be formed by doping an N-type impurity to a second dose which is no greater than about half of the first dose, or by doping a P-type impurity.

The corner impurity-doped region may be formed to adjoin the surface of the substrate, the side surface of the isolation region, the upper surface of the flank impurity-doped region, and the side surface of the upper impurity-doped region.

In accordance with an exemplary embodiment of the present invention, a method of manufacturing a complementary metal oxide semiconductor (CMOS) image sensor is provided. The method includes forming a plurality of isolation regions in a substrate, forming a first impurity-doped region adjoining the side surface of the isolation region and forming an upper impurity-doped region between the surface of the substrate and the first impurity-doped region.

The first impurity-doped region may be formed by doping an N-type impurity to a first dose, and the upper impurity-doped region may be formed by doping an N-type impurity to a second dose which is no greater than about half of the first dose, or by doping a P-type impurity.

The first impurity-doped region may be formed to adjoin the surface of the substrate, and the upper impurity-doped region may be formed to adjoin the side surface of the isolation region.

A corner impurity-doped region may further be formed to adjoin the surface of the substrate, the side surface of the upper impurity-doped region, and the side surface of the isolation region.

The first impurity-doped region may be formed by doping an N-type impurity to a first dose, and the corner impurity-doped region may be formed by doping an N-type impurity to a second dose which is no greater than about half of the first dose or by doping a P-type impurity.

The lower end of the corner impurity-doped region may adjoin the first impurity-doped region.

DETAILED DESCRIPTION OF THE EXEMPLARY EMBODIMENTS

Figure 1A:
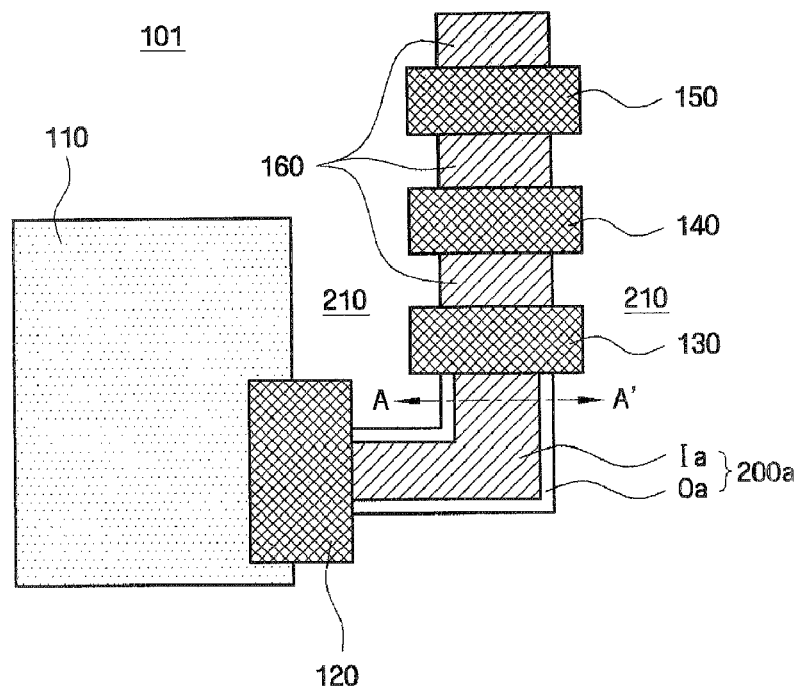
FIGS. 1A through 6D are schematic plan views and longitudinal cross-sectional views illustrating CMOS image sensors in accordance with an exemplary embodiment of the present invention.

It is to be noted that the present invention is not limited to the exemplary embodiments disclosed below, and may be realized to have a variety of different patterns. In the drawings, the sizes and relative sizes of layers and regions may be exaggerated for the sake of clarity in explanation. Wherever possible, the same reference numerals will be used throughout the drawings and the detailed description to refer to the same or like parts.

The exemplary embodiments disclosed in the present specification will be explained with reference to plan views and cross-sectional views, which are regarded as ideally illustrating the present invention. The illustration of the drawings may be modified depending upon manufacturing technologies and/or allowances. Thus, the exemplary embodiments of the present invention are not limited to those illustrated in the drawings, and encompass configurational modifications stemming from manufacturing processes. Therefore, the regions illustrated in the drawings only have schematic properties, and the configurations of the regions shown in the drawings are for illustration of specific shapes of the regions of a device, and do not limit the scope of the present invention.

In the exemplary embodiments of the present invention, various numerical values regarding, for example, the absolute or relative sizes of respective regions, doping doses, energy are provided. These numerical values are provided only for constituting the embodiments which illustrate the technical concepts of the present invention, and do not limit the present invention in any way. While diverse sizes and doping doses and energy will be used depending upon the characteristic of a device, the numerical values provided in the present specification must be understood as being conceptual in corresponding exemplary embodiments.

The term 'doping' used in the present specification indicates a process for implanting ions, and must be understood to include the meaning of injection or implantation.

Hereafter, CMOS image sensors in accordance with the exemplary embodiments of the present invention will be described with reference to the drawings.

FIGS. 1A through 6D are schematic plan views and longitudinal cross-sectional views illustrating CMOS image sensors in accordance with exemplary embodiment of the present invention.

FIG. 1A is a plan view schematically illustrating a CMOS image sensor in accordance with an exemplary embodiment of the present invention.

Referring to FIG. 1A, the CMOS image sensor in accordance with an exemplary embodiment of the present invention includes a photoelectric generation unit 110, a transfer unit 120, a floating diffusion region 200a, a reset unit 130, an amplification unit 140, a selection unit 150, conductive regions 160, and isolation regions 210, which are formed on a substrate 101.

The substrate 101 includes a silicon wafer, an SOI (silicon on insulator) and a compound semiconductor substrate for the manufacture of a semiconductor device. In the present exemplary embodiment, the substrate 101 may be a region doped with predetermined impurities. The doping of the substrate 101 will be described later in detail.

The photoelectric generation unit 110 may comprise, for example, a photodiode, and serves as a region for receiving light and generating electrons or an electric charges corresponding to the light.

The transfer unit 120 may comprise, for example, a transistor, and may be turned on and off to transfer the amount of electric charges, generated in the photoelectric generation unit 110, to the floating diffusion region 200a.

The floating diffusion region 200a shown in FIG. 1A is a region which has conductivity because impurities are doped into the substrate 101. The floating diffusion region 200a may temporarily store the electric charges transferred from the photoelectric generation unit 110, and may transfer the electric charges to the amplification unit 140. The floating diffusion region 200a includes an inner region Ia doped with impurities and an outer region Oa. For example, the inner region Ia may be an N-type impurity-doped region, and the outer region Oa may be a region which is not doped with impurities or is doped to a substrate dose.

The outer region Oa may correspond to a predetermined interval which separates the inner region Ia from the isolation region 210. The interval may correspond to a substrate dose region. The substrate dose will be described later in more detail.

For example, the width of one outer region Oa may be set to about one-tenth of the total width of the inner region Ia and two outer regions Oa, and the width of one inner region Ia my be set to about four-fifths of the total width of two outer regions Oa. These width ratios may be applied to the following exemplary embodiments. However, the ratios are not absolute. For example, the present invention is not limited by the above-described width ratios, and may rather be variously set depending upon the kind and the characteristic of a device.

The inner region Ia and the outer region Oa will be further described later in detail.

The reset section 130 may comprise, for example, a transistor, and may be turned on and off to initialize the floating diffusion region 200*a*. For example, after the electric charges generated in the photoelectric generation unit 110 are stored in the floating diffusion region 200*a* through the transfer unit 120 and are then transferred to the amplification unit 140 or used in a certain way, the reset unit 130 may then initialize the floating diffusion region 200*a* to the state before the electric charges were transferred from the photoelectric generation unit 110 to the floating diffusion region 200*a*. For example, the reset unit 130 may initialize the floating diffusion region 200*a* to a device voltage (Vdd). As the device voltage (Vdd) may be set to various values depending upon a device, it does not have any meaning to present a concrete voltage value.

The amplification unit 140 may comprise, for example, a transistor, and may transfer the amount of electric charges of the floating diffusion region 200*a* to the selection unit 150. For example, the amplification unit 140 may generate a voltage or a current which may be amplified in an analog manner depending upon the amount of electric charges of the floating diffusion region 200*a*. For example, the amplification unit 140 may comprise a source follower circuit. The source follower circuit may be a circuit in which the voltage or the current transferred from a source to a drain changes depending upon the magnitude of the voltage or the current applied to the gate of a transistor.

The selection unit 150 may comprise, for example, a transistor, and may be turned on and off to transmit an electric signal received from the amplification unit 140 to an input and output unit.

The conductive regions 160 may transmit an electric signal. The conductive regions 160 may be formed by doping N-type or P-type impurities in the substrate 101.

The isolation regions 210 may be formed around the component elements. While the isolation regions 210 are not concretely illustrated in FIG. 1A, they are concretely illustrated in other drawings.

Figure 1B:
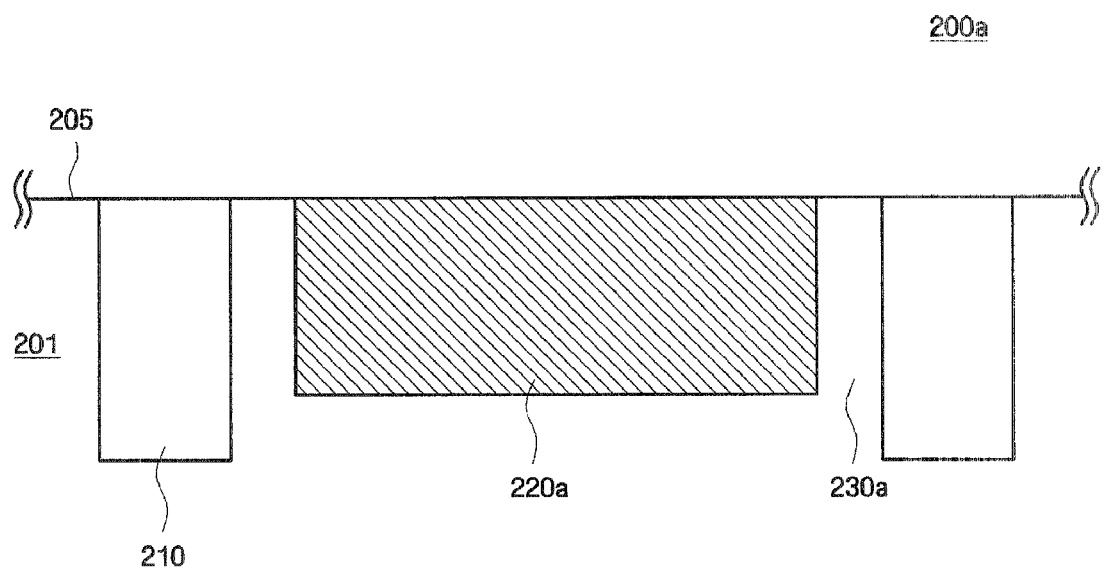

FIG. 1B is a schematic longitudinal cross-sectional view taken along the line A-A' of FIG. 1A, illustrating the CMOS image sensor in accordance with an exemplary embodiment of the present invention.

Referring to FIG. 1B, the CMOS image sensor in accordance with an exemplary embodiment of the present invention includes an isolation region 210, which is formed in a substrate 201, and an inner impurity-doped region 220*a* which is formed to be separated from the isolation region 210 by a predetermined interval 230*a*.

The isolation region 210 functions to isolate the conductive regions of the substrate 201 from one another. In this exemplary embodiment, the isolation region 210 may be an STI (shallow trench isolation) region. The STI region may be formed by defining a trench in a substrate 201 and then filling the trench with an insulation material. In the drawing, the isolation regions 210 are illustrated to have an appropriate size. As each of the isolation regions 210 may be formed wider depending upon the kind of device, in some other devices, unlike the illustration of the drawings attached to the present specification, one or both end surfaces of the isolation region 210 may not be visible. Because the configuration and method of forming the isolation region 210 are well known in the art, further detailed description thereof will be omitted herein.

The inner impurity-doped region 220*a* may be doped with N-type impurities such as, for example, phosphorus (P) ions and arsenic (As) ions. For reference, one or both of P ions and As ions may be doped. For example, ion doping doses and energies at which various experiments are conducted in accordance with the exemplary embodiments of the present invention will be described later in detail in connection with methods in accordance with the exemplary embodiments of the present invention.

A plurality of isolation regions 210 may be formed in the substrate 201. Therefore, the inner impurity-doped region 220*a* may be formed between the isolation regions 210. In certain cases, no inner impurity-doped region 220*a* may be formed between two isolation regions 210.

Meanwhile, the interval 230*a* may correspond to a substrate dose region. In general, a semiconductor device does not use an intrinsic substrate, but uses an extrinsic substrate which is doped with impurities and has polarity. Accordingly, the interval 230*a* of the present exemplary embodiment may correspond to a region which has the dose of a substrate, that is, a substrate dose.

Therefore, while it is possible to state that the inner impurity-doped region 220*a* is separated from the isolation region 210 by the predetermined interval 230*a*, it is also possible to state that another impurity-doped region is formed between the inner impurity-doped region 220*a* and the isolation region 210. In other words, the separation interval 230*a* may be considered as another impurity-doped region.

Figure 2A:
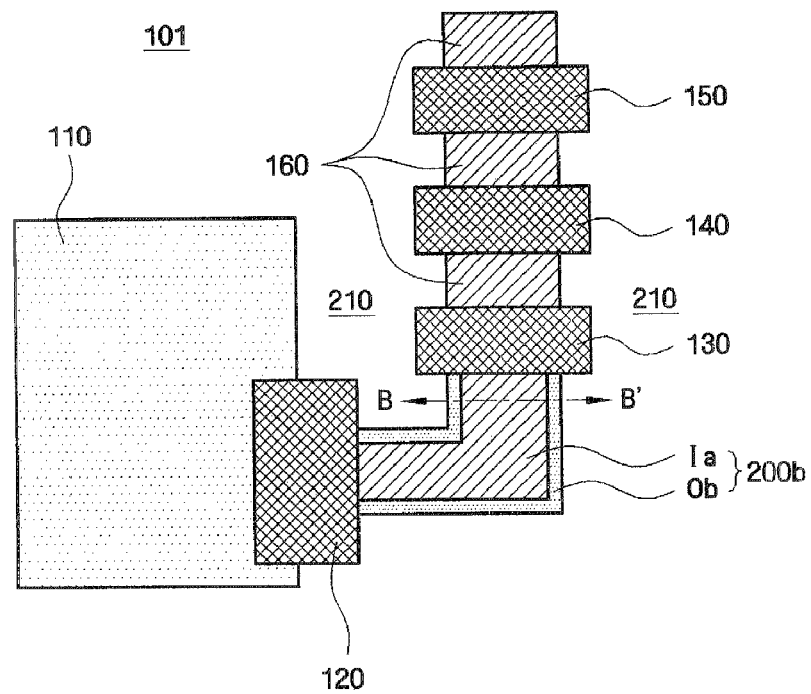

FIG. 2A is a plan view schematically illustrating the CMOS image sensor in accordance with another exemplary embodiment of the present invention.

Referring to FIG. 2A, the CMOS image sensor in accordance with another exemplary embodiment of the present invention includes a photoelectric generation unit 110, a transfer unit 120, a floating diffusion region 200*b*, a reset unit 130, an amplification unit 140, a selection unit 150, conductive regions 160, and isolation regions 210, which are formed on a substrate 101. For the substrate 101, the photoelectric generation unit 110, the transfer unit 120, the reset unit 130, the amplification unit 140, the selection unit 150, the conductive regions 160, and the isolation regions 210, the explanations given in association with FIG. 1A may be referred to.

The floating diffusion region 200*b* shown in FIG. 2A includes an inner region Ia and an outer region Ob which are doped with impurities. The outer region Ob may be a region which is doped with impurities having the same polarity as the inner region Ia but with a different impurity doping dose, or a region which is doped with impurities having a polarity different from that of the inner region Ia.

Figure 2B:
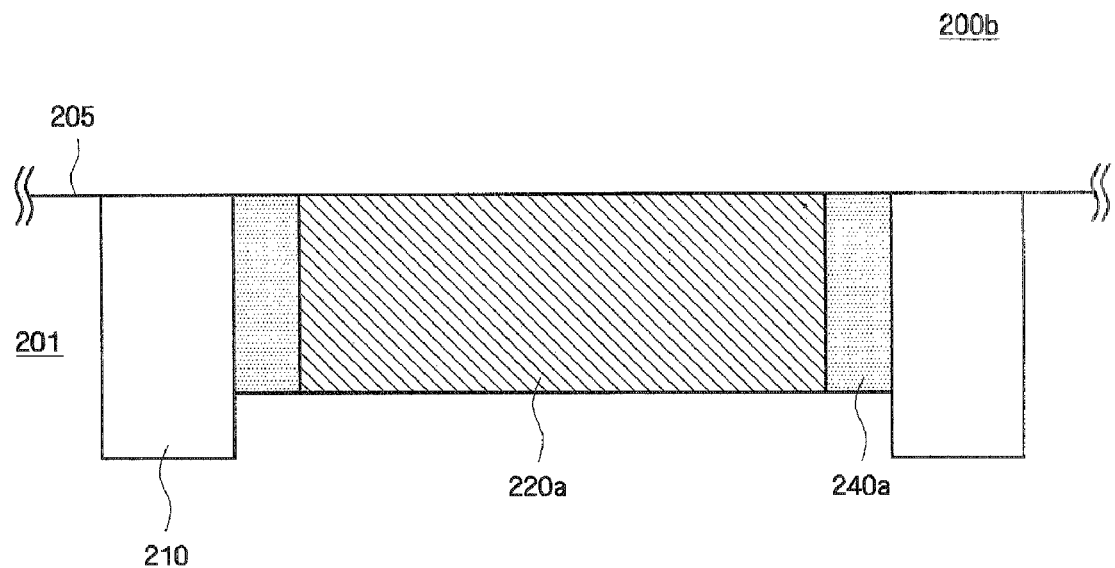

FIG. 2B is a schematic longitudinal cross-sectional view taken along the line B-B' of FIG. 2A, illustrating the CMOS image sensor in accordance with another exemplary In embodiment of the present invention.

Referring to FIG. 2B, the CMOS image sensor in accordance with another exemplary embodiment of the present invention includes an isolation region 210 which is formed in a substrate 201, an outer impurity-doped region 240*a* which is formed to adjoin the side surface of the isolation region 210, and an inner impurity-doped region 220*a* which is formed to adjoin the side surface of the outer impurity-doped region 240*a* and faces away from the isolation region 210. The outer impurity-doped region 240*a* corresponds to the outer region Ob of FIG. 2A, and the inner impurity-doped region 220*a* corresponds to the inner region Ia of FIG. 2A.

The outer impurity-doped region 240*a* may be formed to adjoin the side surface of the isolation region 210.

The inner impurity-doped region 220a may be formed to adjoin the outer impurity-doped region 240a and oppose to the isolation region 210. The inner impurity-doped region 220a may be formed to be wider than the outer impurity-doped region 240a.

The outer impurity-doped region 240a and the inner impurity-doped region 220a may be doped with impurities having the same polarity. For example, they may be doped with N-type impurities. In this case, for example, the outer impurity-doped region 240a may be doped to a doping dose which corresponds to about half of the doping dose of the inner impurity-doped region 220a.

Also, in the case where the outer impurity-doped region 240a and the inner impurity-doped region 220a are doped with impurities having opposite polarities, the outer impurity-doped region 240a may be doped with P-type impurities, and the inner impurity-doped region 220a may be doped with N-type impurities.

Still referring to the drawing, a plurality of isolation regions 210 may be formed, and the outer impurity-doped region 240a and the inner impurity-doped region 220a may be formed between the isolation regions 210. Also, the inner impurity-doped region 220a may be formed between the outer impurity-doped regions 240a.

Figure 3A:
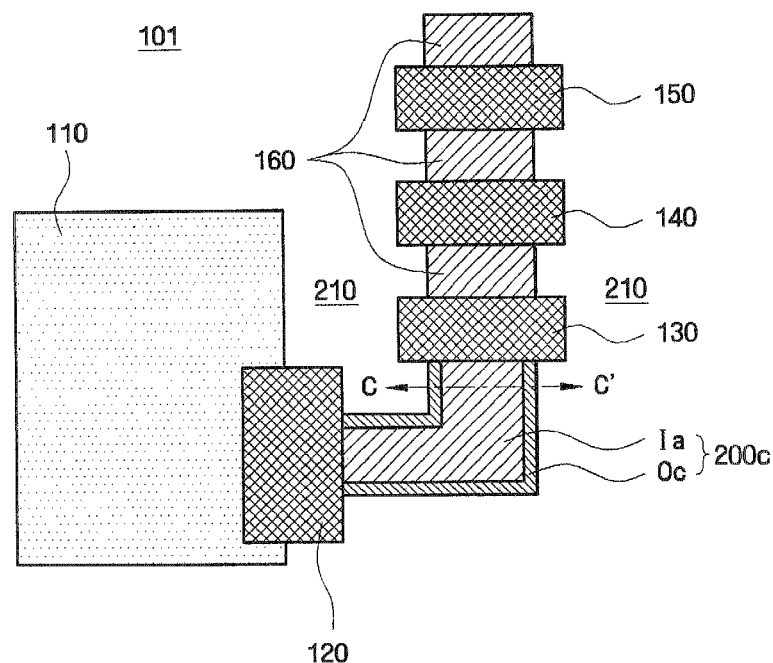

FIG. 3A is a plan view schematically illustrating the CMOS image sensor in accordance with another exemplary embodiment of the present invention.

Referring to FIG. 3A, the CMOS image sensor in accordance with another exemplary embodiment of the present invention includes a photoelectric generation unit 110, a transfer unit 120, a floating diffusion region 200c, a reset unit 130, an amplification unit 140, a selection unit 150, conductive regions 160, and isolation regions 210, which are formed on a substrate 101. For the substrate 101, the photoelectric generation unit 110, the transfer unit 120, the reset unit 130, the amplification unit 140, the selection unit 150, the conductive regions 160, and the isolation regions 210, the explanations given in association with FIG. 1A may be referred to.

The floating diffusion region 200c shown in FIG. 3A includes an inner region Ia and an outer region Oc, which are doped with impurities. The outer region Oc may be formed to have, for example, a double-layered structure.

As described above in connection with FIG. 2A, the inner region Ia and the outer region Oc may be regions which are doped with impurities having the same polarity but with different doping doses, or regions which are doped with impurities having different polarities.

For example, the inner region Ia may be doped with N-type impurities, and the outer region Oc may be doped with the same N-type impurities but to a lower doping dose. For example, the outer region Oc may be doped with impurities to a doping dose which is no greater than about half of the doping dose of the inner region Ia.

As another example, the inner region Ia may be doped with N-type impurities, and the outer region Oc may be doped with P-type impurities. In addition, the outer region Oc may have, for example, a double-layered structure. The case in which the outer region Oc has a double-layered structure will be described later with reference to FIGS. 3B and 3C.

Figure 3B:
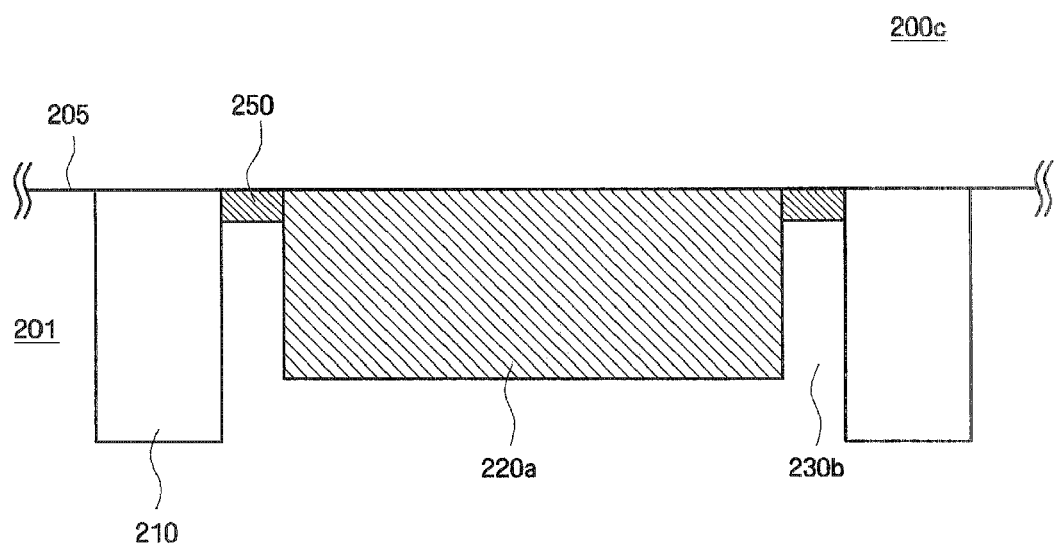
Figure 3C:
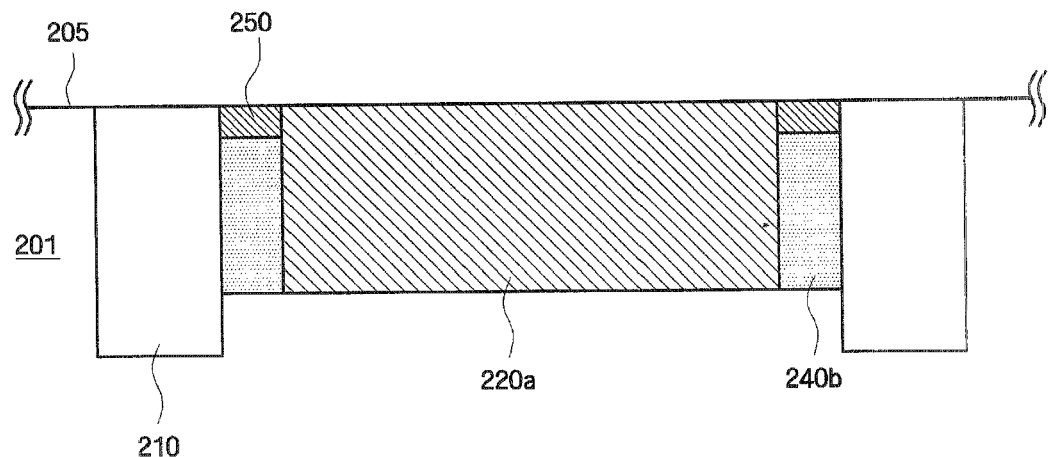

FIGS. 3B and 3C are schematic longitudinal cross-sectional views taken along the line C-C' of FIG. 3A, illustrating the CMOS image sensors in accordance with another exemplary embodiment of the present invention.

Referring to FIG. 3B, when compared to FIG. 1B, a corner impurity-doped region 250 may be formed at the upper end of an interval 230b which separates an inner impurity-doped region 220a and the isolation region 210 from each other, to adjoin the surface 205 of a substrate 201. The corner impurity-doped region 250 may be doped with N-type or P-type impurities. The interval 230b may be illustrated as being equal to the width of the corner impurity-doped region 250 for the sake of clarity in illustration. For example, the width of the corner impurity-doped region 250 may be greater or less than the interval 230b. Further, the depth of the corner impurity-doped region 250 may not be greater than that of the inner impurity-doped region 220a.

Referring to FIG. 3C, when compared to FIG. 2B, a corner impurity-doped region 250 may be formed at the upper end of an outer impurity-doped region 240b. Particularly, the corner impurity-doped region 250 may be a region which is doped with impurities having the same polarity as an inner impurity-doped region 220a but at a different impurity doping dose, or a region which is doped with impurities having a polarity different from that of the inner impurity-doped region 220a. For example, in the case where the corner impurity-doped region 250 may be doped with the same impurities as the inner impurity-doped region 220a, the corner impurity-doped region 250 may be a region which is doped to a doping dose lower than that of the inner impurity-doped region 220a, for example, to a doping dose corresponding to about half of the doping dose of the inner impurity-doped region 220a.

In the case where the corner impurity-doped region 250 may be doped with impurities having a polarity different from that of the impurities for doping the inner impurity-doped region 220a, the inner impurity-doped region 220a may be a region which is doped with N-type impurities, and the corner impurity-doped region 250 may be a region which is doped with P-type impurities. At this time, for example, when the outer impurity-doped region 240b may be a region which is doped with P-type impurities, the doping dose of the corner impurity-doped region 250 may be set to be greater than that of the outer impurity-doped region 240b.

Figure 4A:
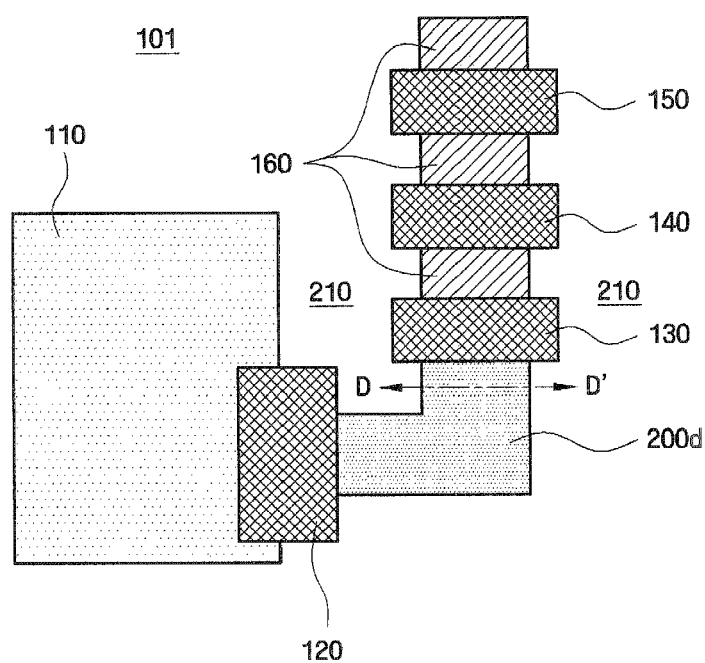

FIG. 4A is a plan view schematically illustrating the CMOS image sensor in accordance with another exemplary embodiment of the present invention.

Referring to FIG. 4A, the CMOS image sensor in accordance with another exemplary embodiment of the present invention includes a photoelectric generation unit 110, a transfer unit 120, a floating diffusion region 200d, a reset unit 130, an amplification unit 140, a selection unit 150, conductive regions 160, and isolation regions 210, which are formed on a substrate 101. For the substrate 101, the photoelectric generation unit 110, the transfer unit 120, the reset unit 130, the amplification unit 140, the selection unit 150, the conductive regions 160, and the isolation regions 210, the explanations given in association with FIG. 1A may be referred to.

The floating diffusion region 200d shown in FIG. 4A includes an upper impurity-doped region 260a which is formed to adjoin the surface 205 of a substrate 201. The floating diffusion region 200d may be formed to have, for example, a double-layered structure. This will be described in detail with reference to FIGS. 4B through 4D.

Figure 4B:
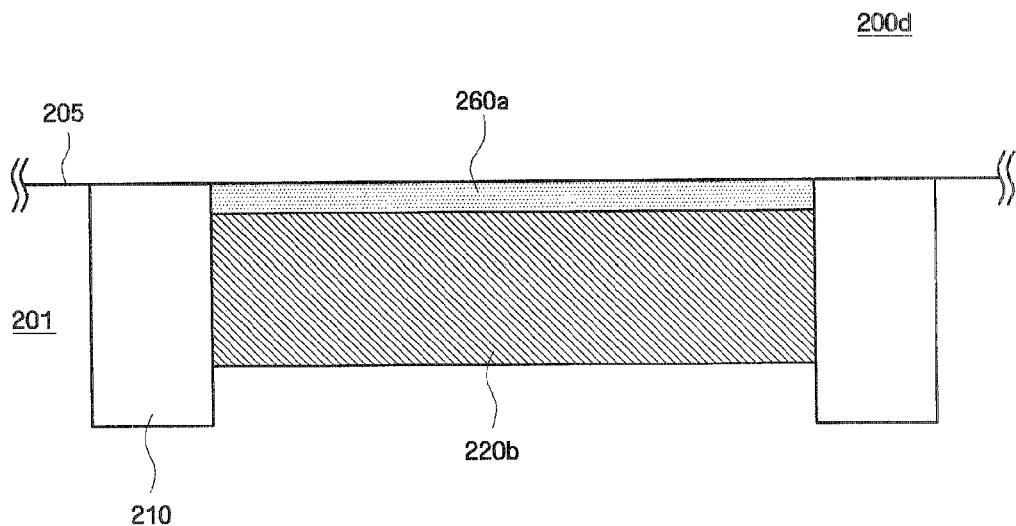
Figure 4C:
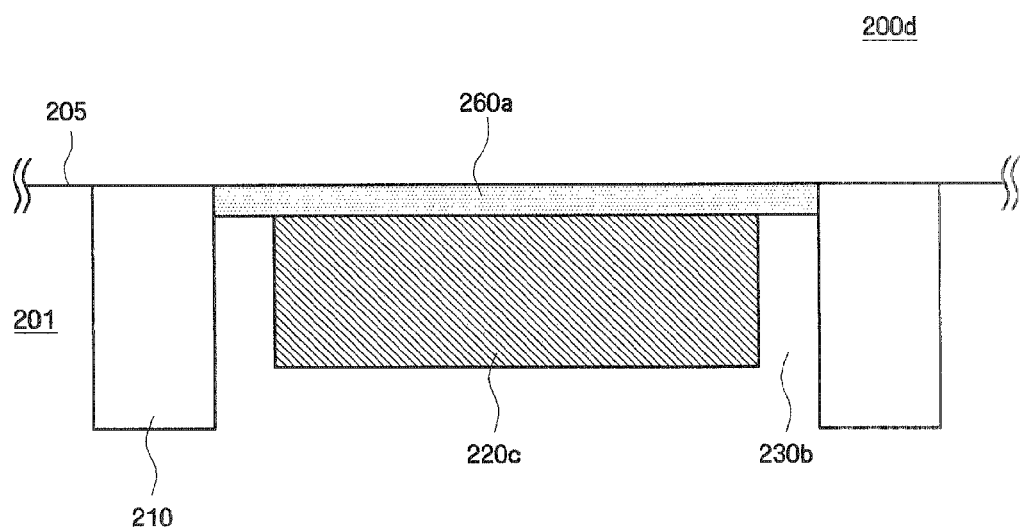
Figure 4D:
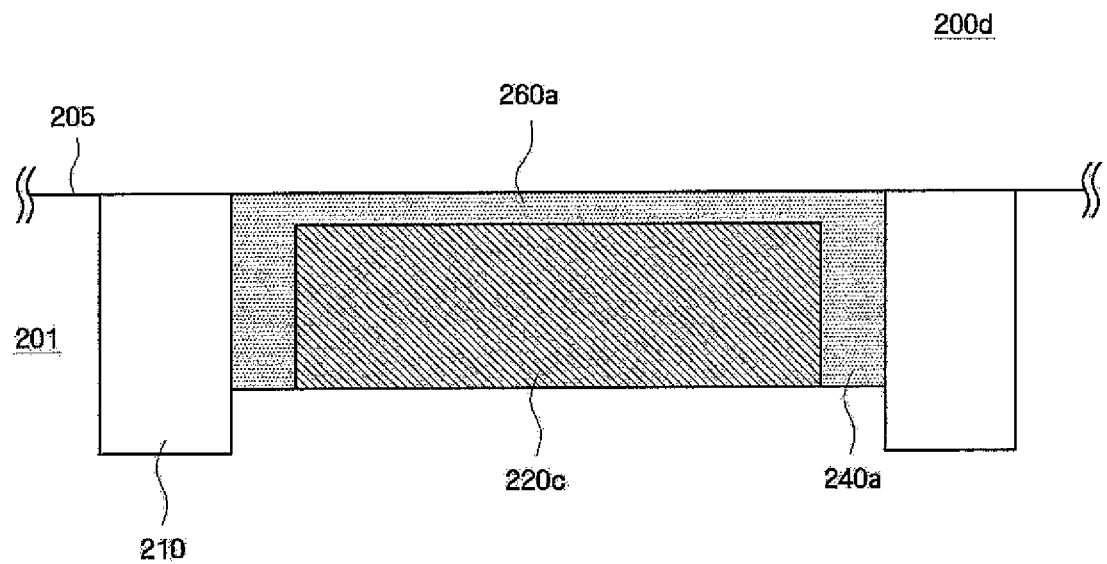

FIGS. 4B through 4D are schematic longitudinal cross-sectional views taken along the line D-D' of FIG. 4A, illustrating the CMOS image sensors in accordance with another exemplary embodiment of the present invention.

Referring to FIG. 4B, the CMOS image sensor in accordance with another exemplary embodiment of the present invention includes an isolation region 210 which is formed in the substrate 201, the upper impurity-doped region 260a which is formed to adjoin the surface 205 of the substrate 201 and the isolation layer 210, and a lower impurity-doped region 220b which is formed on the lower end of the upper impurity-doped region 260a.

The upper impurity-doped region 260a may be formed to adjoin the surface 205 of the substrate 201 between isolation regions 210. For example, the upper impurity-doped region 260a may adjoin the side surfaces of the isolation regions 210.

The upper impurity-doped region 260a may be a region which is doped with impurities having the same polarity as the impurities of the lower impurity-doped region 220b. In this case, the upper impurity-doped region 260a may be a region which is doped with impurities to a doping dose lower than that of the lower impurity-doped region 220b. For example, the upper impurity-doped region 260a may be a region which is doped to a doping dose corresponding to about half of the impurity doping dose of the lower impurity-doped region 220b.

Also, the upper impurity-doped region 260a may be a region which is doped with impurities having a polarity opposite to that of the lower impurity-doped region 220b. For example, the lower impurity-doped region 220b may be region which is doped with N-type impurities, and the upper impurity-doped region 260a may be a region which is doped with P-type impurities.

Referring to FIG. 4C, the CMOS image sensor in accordance with another exemplary embodiment of the present invention includes an isolation region 210 which is formed in a substrate 201, an upper impurity-doped region 260a which is formed to adjoin the surface 205 of the substrate 201 and the isolation region 210, and a lower impurity-doped region 220c which is formed at the lower end of the upper impurity-doped region 260a and is separated from the side surface of the isolation region 210 by a predetermined interval 230b.

For the interval 230b of FIG. 4C, that is, the interval 230b between the lower impurity-doped region 220c and the isolation region 210, the explanations given in association with FIG. 1B may be referred to.

Referring to FIG. 4D, the CMOS image sensor in accordance with another exemplary embodiment of the present invention includes an isolation region 210 which is formed in a substrate 201, an upper impurity-doped region 260a which is formed to adjoin the surface 205 of the substrate 201, a flank impurity-doped region 240a which is formed to adjoin the side surface of the isolation region 210, and a lower impurity-doped region 220c which is formed to adjoin the lower end of the upper impurity-doped region 260a and the flank impurity-doped region 240a.

For the flank impurity-doped region 240a and the lower impurity-doped region 220c of FIG. 4D, the explanations given in association with FIG. 2B may be referred to.

For the upper impurity-doped region 260a of FIG. 4d, the upper impurity-doped region 260a of FIGS. 4A through 4C may be referred to.

The corner region which adjoins the surface 205 of the substrate 201 and the side surface of the isolation region 210 may be formed in a variety of ways. For example, the upper impurity-doped region 260a may be formed to extend in a horizontal direction, the flank impurity-doped region 240a may be formed to extend in a vertical direction, or the upper impurity-doped region 260a and the flank impurity-doped region 240a may overlap each other.

Also, the respective impurity-doped regions 220c, 240a and 260a may be doped with impurities having the same polarity. In this case, the upper impurity-doped region 260a and the flank impurity-doped region 240a may be doped to a doping dose lower than that of the lower impurity-doped region 220c, for example, to a doping dose corresponding to about half of the doping dose of the lower impurity-doped region 220c.

Figure 5A:
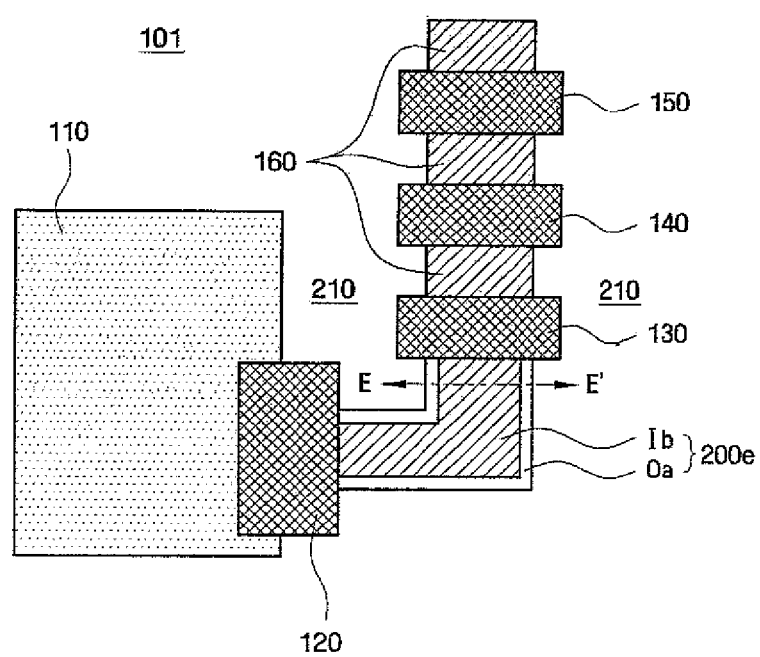

FIG. 5A is a plan view schematically illustrating a CMOS image sensor in accordance with another exemplary embodiment of the present invention.

Referring to FIG. 5A, the CMOS image sensor in accordance with another exemplary embodiment of the present invention includes a photoelectric generation unit 110, a transfer unit 120, a floating diffusion region 200e, a reset unit 130, an amplification unit 140, a selection unit 150, conductive regions 160, and isolation regions 210, which are formed on a substrate 101. For the substrate 101, the photoelectric generation unit 110, the transfer unit 120, the reset unit 130, the amplification unit 140, the selection unit 150, the conductive regions 160, and the isolation regions 210, the explanations given in association with FIG. 1A may be referred to.

The floating diffusion region 200e shown in FIG. 5A may include an inner region Ib and an outer region Oa. For example, the inner region Ib may include an upper impurity-doped region 260b. For example, the inner region Ib may be formed to have a double-layered structure.

Figure 5B:
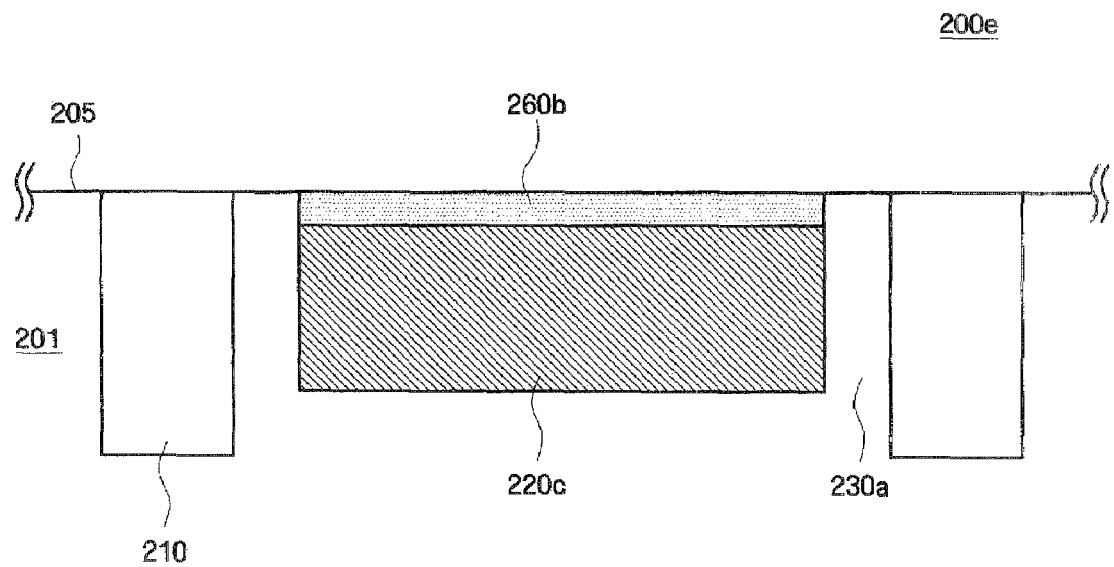

FIG. 5B is a schematic longitudinal cross-sectional view taken along the line E-E' of FIG. 5A, illustrating the CMOS image sensor in accordance with another exemplary embodiment of the present invention.

Referring to FIG. 5B, the CMOS image sensor in accordance with another exemplary embodiment of the present invention includes an isolation region 210 which is formed in a substrate 201, an upper impurity-doped region 260b which is formed to adjoin the surface 205 of the substrate 201 and is separated from the isolation region 210, and a lower impurity-doped region 220c which is formed to adjoin the lower end of the upper impurity-doped region 260b and is separated from the isolation region 210 by a predetermined interval 230a.

The upper impurity-doped region 260b and the lower impurity-doped region 220c may be regions which are doped with impurities having the same polarity. In this case, the two impurity-doped regions 260b and 220c may be doped with N-type impurities, and the upper impurity-doped region 260b may be a region which is doped with impurities having a doping dose corresponding to about half of the doping dose of the lower impurity-doped region 220c.

Also, the upper impurity-doped region 260b may be a region which is doped with impurities having a polarity opposite to that of the lower impurity-doped region 220c. For example, the upper impurity-doped region 260b may be a region which is doped with P-type impurities, and the lower impurity-doped region 220c may be a region which is doped with N-type impurities.

Figure 6A:
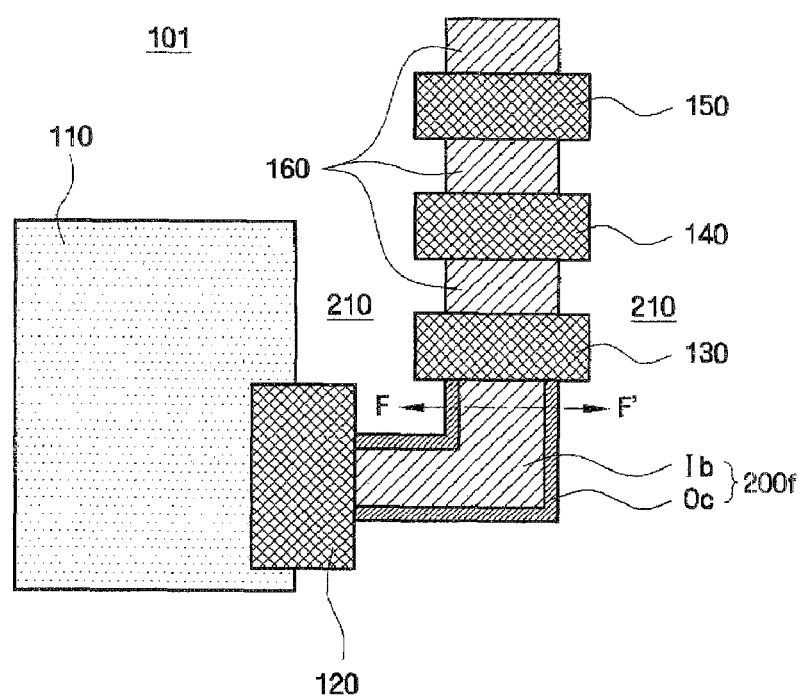

FIG. 6A is a plan view schematically illustrating a CMOS image sensor in accordance with another exemplary embodiment of the present invention.

Referring to FIG. 6A, the CMOS image sensor in accordance with another exemplary embodiment of the present invention includes a photoelectric generation unit 110, a transfer unit 120, a floating diffusion region 200f, a reset unit 130, an amplification unit 140, a selection unit 150, conductive regions 160, and isolation regions 210, which are formed on a substrate 101. For the substrate 101, the photoelectric generation unit 110, the transfer unit 120, the reset unit 130, the amplification unit 140, the selection unit 150, the conductive regions 160, and the isolation regions 210, the explanations given in association with FIG. 1A may be referred to.

The floating diffusion region 200f shown in FIG. 6A includes an inner region Ib and an outer region Oc. The inner region Ib and the outer region Oc may be regions which are doped with impurities having the same polarity but with different doping doses, or regions which are doped with impurities having opposite polarities. The inner region Ib or the outer region Oc may be formed to have, for example, a double-layered structure. A more detailed description for FIG. 6A will be given with reference to FIGS. 6B and 6C.

Figure 6B:
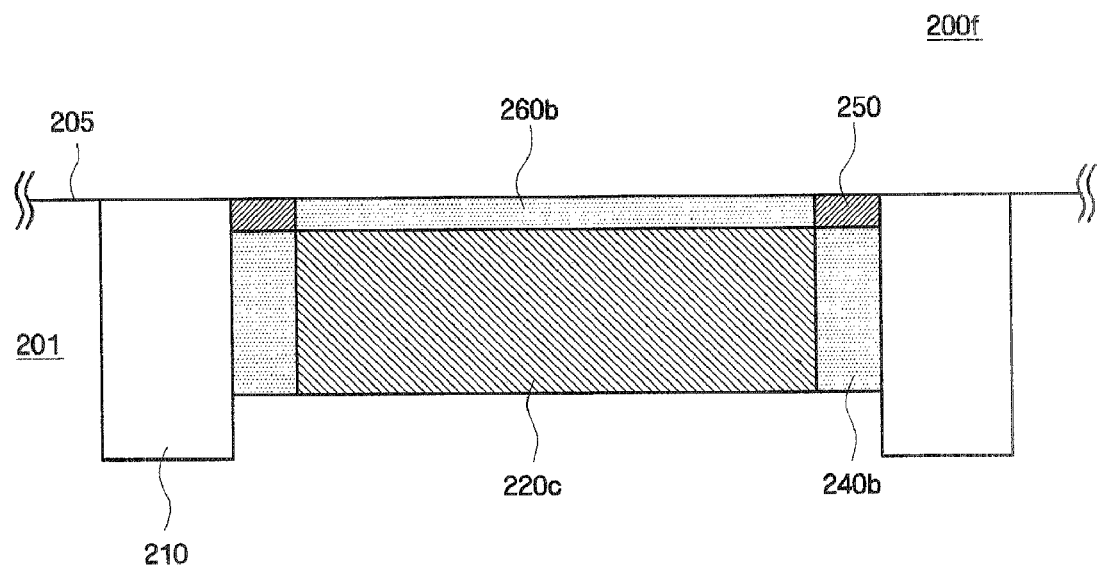
Figure 6C:
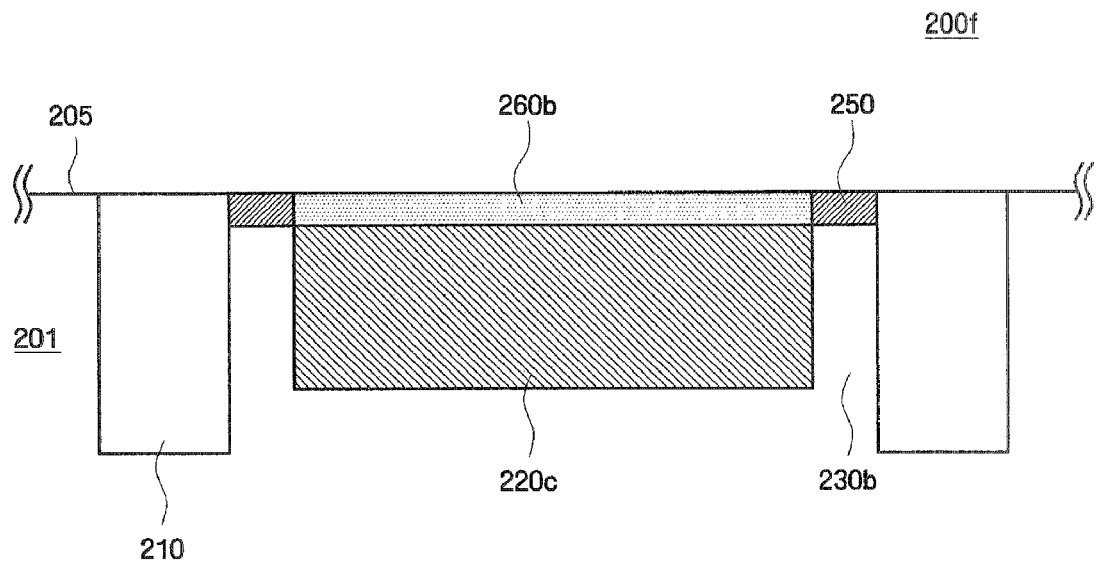
Figure 6D:
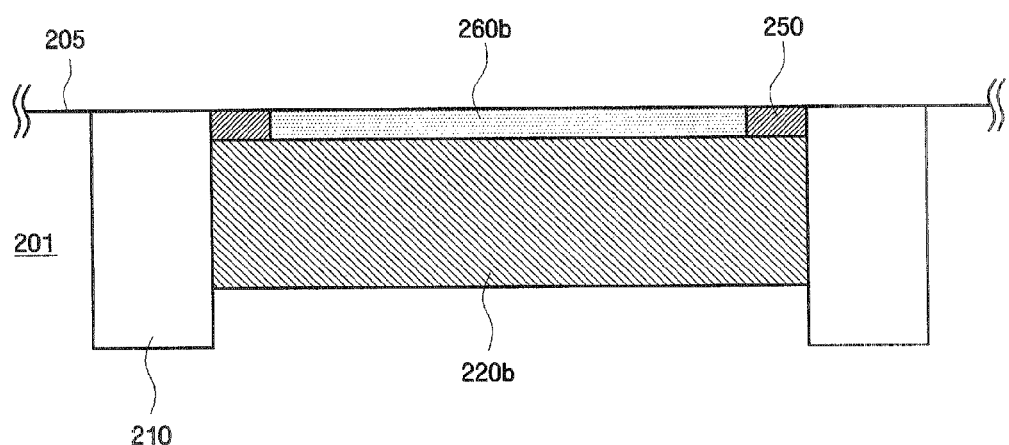

FIGS. 6B through 6D are schematic longitudinal cross-sectional views taken along the line F-F' of FIG. 6A, illustrating the CMOS image sensors in accordance with another exemplary embodiment of the present invention.

Referring to FIG. 6B, the CMOS image sensor in accordance with another exemplary embodiment of the present invention includes an isolation region 210 which is formed in a substrate 201, a corner impurity-doped region 250 which is formed to adjoin the surface 205 of the substrate 201 and the side surface of the isolation region 210, an upper impurity-doped region 260b which is formed to adjoin the surface 205 of the substrate 201 and the side surface of the corner impurity-doped region 250, a flank impurity-doped region 240b which is formed to adjoin the lower end of the corner impurity-doped region 250 and the side surface of the isolation region 210, and a lower impurity-doped region 220c which is formed to adjoin the lower end of the upper impurity-doped region 260b and the side surface of the flank impurity-doped region 240b.

The corner impurity-doped region 250, the upper impurity-doped region 260b, the flank impurity-doped region 240b and the lower impurity-doped region 220c may be regions which are doped with impurities having the same polarity. For example, the corner impurity-doped region 250, the upper impurity-doped region 260b and the flank impurity-doped region 240b may be regions which are doped with impurities to a doping dose corresponding to about half of the doping dose of the lower impurity-doped region 220c.

However, the corner impurity-doped region 250, the upper impurity-doped region 260b and the flank impurity-doped region 240b may not be doped with impurities to the same doping dose. For example, they may be regions which are doped to a doping dose lower than that of the lower impurity-doped region 220c, and may be doped to different doping doses.

In addition, the corner impurity-doped region 250 may be formed to overlap the upper impurity-doped region 260b and the flank impurity-doped region 240b when forming the upper impurity-doped region 260b and the flank impurity-doped region 240b, or may be formed through a separate doping process.

Meanwhile, at least one of the corner impurity-doped region 250, the upper impurity-doped region 260b and the flank impurity-doped region 240b may be a region which is doped with impurities having a polarity opposite to that of the lower impurity-doped region 220c. For example, the lower impurity-doped region 220c may be a region which is doped with N-type impurities, and at least one of the corner impurity-doped region 250, the upper impurity-doped region 260b and the flank impurity-doped region 240b may be a region which is doped with P-type impurities.

In addition, in the case where at least two among the corner impurity-doped region 250, the upper impurity-doped region 260b and the flank impurity-doped region 240b are regions which are doped with P-type impurities, the corner impurity-doped region 250 may be a region which is doped with impurities to a doping dose greater than that of the upper impurity-doped region 260b or the flank impurity-doped region 240b. In the case that all the three regions 250, 260b and 240b are regions which are doped with P-type impurities, the corner impurity-doped region 250 may be the region which is doped to the highest doping dose.

Referring to FIG. 6C, the CMOS image sensor in accordance with another exemplary embodiment of the present invention includes an isolation region 210 which is formed in a substrate 201, a corner impurity-doped region 250 which is formed to adjoin the surface 205 of the substrate 201 and the side surface of the isolation region 210, an upper impurity-doped region 260b which is formed to adjoin the surface 205 of the substrate 201 and the side surface of the corner impurity-doped region 250, and an inner impurity-doped region 220c which is formed to adjoin the lower end of the upper impurity-doped region 260b and is separated from the side surface of the isolation region 210 by a predetermined interval 230b.

For the respective impurity-doped regions 250, 260b and 220c shown in FIG. 6C, the explanations given in association with FIG. 6B may be referred to, and for the separation interval 230b, the explanations given in association with FIGS. 3B and 4C may be referred to.

For example, for the polarities and doses of the impurities of the corner impurity-doped region 250, the upper impurity-doped region 260b and the lower impurity-doped region 220c, the explanations given in association with FIG. 6B may be referred to, and for the impurities and the dose of the predetermined interval 230b, the explanations given in association with FIGS. 3B and 4C may be referred to.

Referring to FIG. 6D, the CMOS image sensor in accordance with another exemplary embodiment of the present invention includes an isolation region 210 which is formed in a substrate 201, a corner impurity-doped region 250 which is formed to adjoin the surface 205 of the substrate 201 and the side surface of the isolation region 210, an upper impurity-doped region 260b which is formed to adjoin the surface 205 of the substrate 201 and the side surface of the corner impurity-doped region 250, and a lower impurity-doped region 220b which is formed to adjoin the lower ends of the upper impurity-doped region 260b and the corner impurity-doped region 250 and the side surface of the isolation region 210.

For the corner impurity-doped region 250 and the upper impurity-doped region 260b, the explanations given in association with FIGS. 6B and 6C may be referred to, and for the lower impurity-doped region 220b, the explanations given in association with FIG. 4B may be referred to.

Further detailed descriptions regarding the polarities and the doping doses of the impurities doped into the various impurity-doped regions will be given in the following methods for manufacturing CMOS image sensors according to the exemplary embodiments of the present invention.

In the exemplary embodiments of the present invention, first through third doping masks M1, M2 and M3 may comprise, for example a photoresist or an insulator including an oxide layer or a nitride layer. The respective doping masks are divided based on longitudinal cross-sectional shapes for forming various impurity-doped regions 220, 240, 250 and 260 in a local region, that is, the floating diffusion region 200. Although the masks have the same pattern in the floating diffusion region, they may have different patterns in other regions. For example, although the same reference numeral is used for several masks, the masks may have different pattern shapes.

The substrate 201 which is used in the various embodiments described in the present specification may comprise, for example, a silicon substrate, an SOI substrate or a compound semiconductor substrate for the manufacture of a semiconductor device. The substrate 201 may be a substrate which is doped with impurities to a predetermined substrate dose.

The isolation regions 210 which are illustratively provided in the various exemplary embodiments described in the present specification may be formed through an STI process.

For example, the isolation regions 210 may be formed to have a depth of about 4,000 to about 4,500 angstroms (Å). Also, the distance between the isolation regions 210 may be about 0.6 micrometers (μm). As the isolation region 210 may be embodied in a variety of ways depending upon the kind and the characteristic of a semiconductor device, the exemplary embodiments of the present invention are not limited to the dimensions set forth herein.

In the exemplary embodiments of the present invention, the region which is not doped with impurities may be explained as a substrate dose region. For example, the substrate dose region may imply a dose of about 1.2E15/cm3 of B ions. However, in the case where an epitaxial process and so forth are implemented, the substrate dose may be further lowered. Therefore, the substrate dose exemplified in the exemplary embodiments, that is, the dose of boron (B) ions, may vary depending upon the kind and the characteristic of a semiconductor device. As the substrate dose may be variously embodied depending upon the kind and the characteristics of a semiconductor device, the exemplary embodiments of the present invention are not limited to the doses set forth herein.

In the exemplary embodiments of the present invention, impurity doping doses and energies may be substantially divided into four types. In the exemplary embodiments of the present invention, for the sake of easy understanding, these doping doses and energies are called N+, N−, P+ and P−. However, the impurity doping doses and energies need not be necessarily divided into four types. For example, various impurity-doped regions may be formed to various impurity doping doses and energies through conducting numerous experiments.

The reason why the impurity doping doses and energies are divided into four types in the exemplary embodiments is to enable impurity doping processes to be easily and conveniently performed in view of the kind, compatibility, and ease of a semiconductor device manufacturing method. In other words, in a semiconductor device manufacturing procedure, at least four impurity doping processes are used. As a consequence, the four impurity doping types exemplified in the embodiment are compatible with the conventional semiconductor device manufacturing procedure, and may be implemented without requiring a separate process. If five or more impurity doping processes are used in a semiconductor device manufacturing procedure, the impurity-doped regions of the exemplary embodiments of the present invention may be formed at more varied impurity doping doses and energies. When the performance of a semiconductor device is important, it is worthwhile to consider the various doping doses and energies.

For the purpose of illustration of the present invention, an N+ process may include, for example, an impurity doping process in which P ions are doped at a dose of about 2.0E13 and As ions are doped at a dose of about 5.0E15. An N− process may include, for example, an impurity doping process in which As ions are doped at a dose of about 2.5E15. A P+ process may include, for example, an impurity doping process in which B ions are doped at a dose of about 3.0E15. Also, a P− process may include, for example, an impurity doping process in which B ions are doped at a dose of about 5.0E12. Diverse impurity doping doses may be adopted in conformity with, for example, the kind, the size, the characteristic, of a semiconductor device.

Hence, in the exemplary embodiments of the present invention, N+, N−, P+ and P− impurity-doped regions may be understood as being used to compare the kinds of impurities to be doped and the relative high and low states of the doses in the impurity-doped regions. For example, the term "N+ impurity-doped region" may be understood to mean an impurity-doped region which is formed by being doped with N-type impurities at a higher doping dose compared to the N− impurity-doped region, and the term "N− impurity-doped region" may be understood to mean an impurity-doped region which is formed by being doped with N-type impurities at a lower doping dose compared to the N+ doped region. Similarly, the term "P+ impurity-doped region" may be understood to mean an impurity-doped region which is formed by being doped with P-type impurities at a higher doping dose compared to the P− impurity-doped region, and the term "P− impurity-doped region" may be understood to mean an impurity-doped region which is formed by being doped with P-type impurities at a lower doping dose compared to the P+ doped region.

Meanwhile, assuming that impurity doping doses are not used in other processes but are used in the impurity doping process for forming the floating diffusion region 200, an N+ dose may be about two or more times greater than an N− dose, and a P+ dose may be about two or more times greater than a P− dose.

In the exemplary embodiments of the present invention, the sizes of the respective component elements are set as described below only for the purposes of illustration. For example, the isolation region 210 may be formed at a depth of about 4,000 to about 4,500 Å. The distance between the isolation regions 210 may be about 0.6 μm. The separation interval 230, that is, the impurity-doped regions 240 and 250, which adjoin the isolation region 230, may be formed to have a width of about 0.06 μm. The impurity-doped regions 250 and 260 which are formed to adjoin the surface 205 of the substrate 201 may be formed to have a depth of about 0.03 μm. The impurity-doped region 220 which adjoins the surface 205 of the substrate 201 and does not adjoin the isolation region 210 has a width of about 0.48 μm, and may extend from the surface 205 of the substrate 201 to a depth of about 0.48 μm.

However, these dimensions are not absolute because the dimensions of the respective component elements may vary depending upon the kind, the characteristic and the design of a semiconductor device. Also, even though semiconductor devices are manufactured according to a consistent design rule, the resultant configurations may vary due to, for example, the misalignment of the component elements, the diffusion of impurity ions, and the overlap of respective regions.

The interval 230a by which the impurity-doped region 220a is separated from the isolation region 210 may be set to about one-tenth of the distance between the isolation regions 210. For example, in this exemplary embodiment, as the distance between the isolation regions 210 is illustratively set to 0.6 μm, the interval 230a is about 0.06 μm. Also, the depth of the impurity-doped region 220a may be set to be no deeper than the isolation region 210, and in this exemplary embodiment, the impurity-doped region 220a may be formed to have a depth of about 3,000 to about 3,500 Å when measured from the surface 205 of the substrate 201.

FIGS. 7A through 11C are longitudinal cross-sectional views for explaining the methods of forming the structures shown in FIGS. 1A through 6D. For example, these drawings show the cross-sectional views taken along the lines A-A' through F-F', and are not limited to a specific one of the cross-sectional views.

Figure 7A:
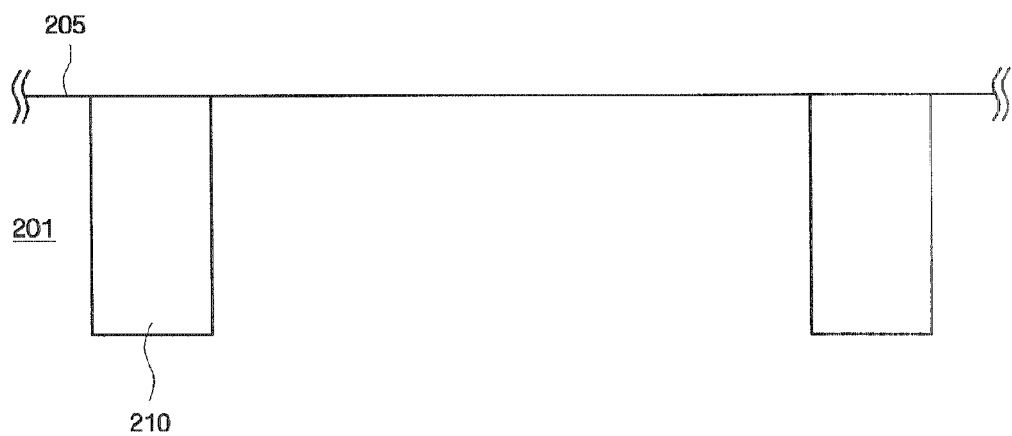
FIGS. 7A through 11C are longitudinal cross-sectional views for explaining methods for manufacturing the CMOS image sensors in accordance with an exemplary embodiment of the present invention.

Referring to FIG. 7A, to manufacture the CMOS image sensors in accordance with the exemplary embodiments of the present invention, the isolation region 210 is first formed in the substrate 201.

A plurality of isolation regions 210 may be formed. Also, the isolation regions 210 may have various sizes and may be different with respect to the shape of a certain portion from those shown in the drawings. For example, the isolation region 210 may be very wide. In the drawings, for the sake of easy understanding of the exemplary embodiments of the present invention, the isolation regions 210 are illustrated as all being narrow.

Figure 7B:
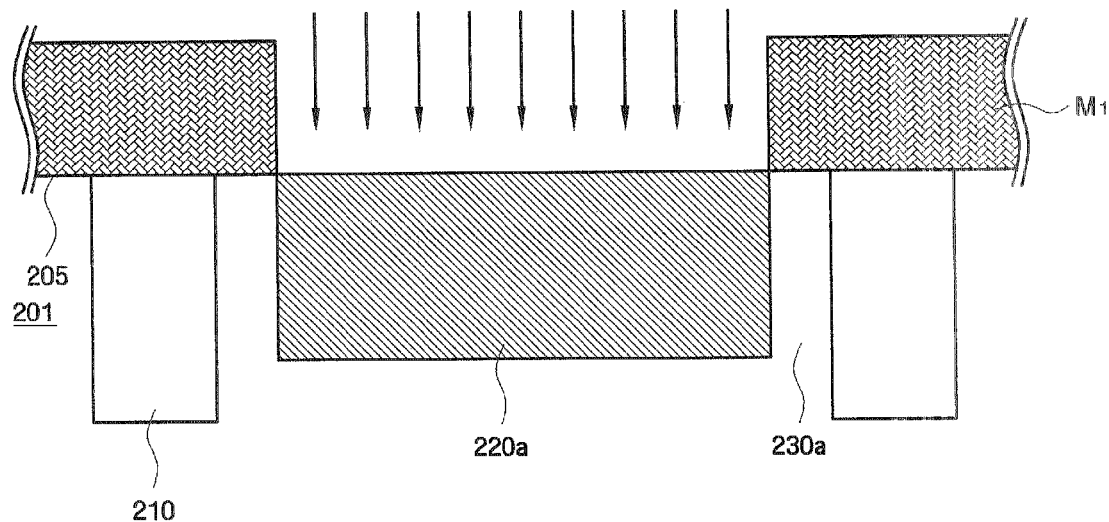

Referring to FIG. 7B, after the step of FIG. 7A, a first doping mask M1 is formed on the substrate 201, and then an impurity-doped region 220a is formed by doping impurities. For example, in a state in which the first doping mask M1 is formed in a manner such that the impurity-doped region 220a may be separated from the side surface of the isolation region 210 by the predetermined interval 230a, impurities are doped. The impurity-doped region 220a may be, for example, an N+ impurity-doped region. The first doping mask M1 may be formed as, for example, a photoresist pattern. Alternatively, the first doping mask M1 may be formed as an insulation layer including, for example, an oxide layer or a nitride layer.

For Example, the step of FIG. 7B may form the floating diffusion region 220a of the CMOS image sensor in accordance with an exemplary embodiment of the present invention as shown in FIG. 1B.

Figure 7C:
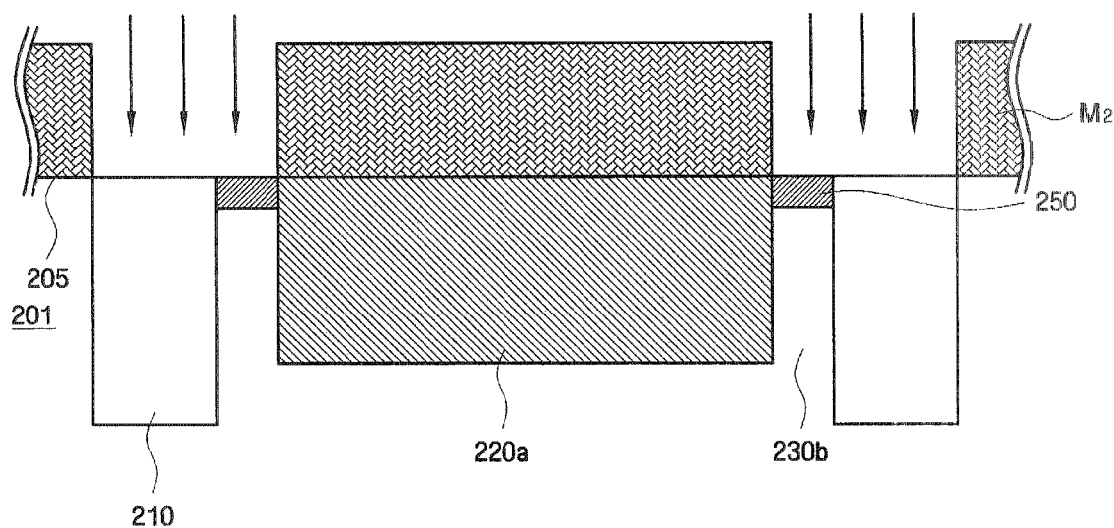

Referring to FIG. 7C, after the step of FIG. 7B, a second doping mask M2 is formed, and the corner impurity-doped region 250 is formed by doping impurities. The second doping mask M2 may have a reverse pattern to the first doping mask M1 in the floating diffusion region 200c. For example, the second doping mask M2 may be a pattern obtained by masking the surface 205 of the substrate 201 excluding portions of the floating diffusion region 200c and the isolation region 210.

The corner impurity-doped region 250 may be, for example, an N–, P+ or P– impurity-doped region.

For example, the step of FIG. 7C may form the floating diffusion region 200c of the CMOS image sensor in accordance with another exemplary embodiment of the present invention as shown in FIG. 3B.

Figure 8A:
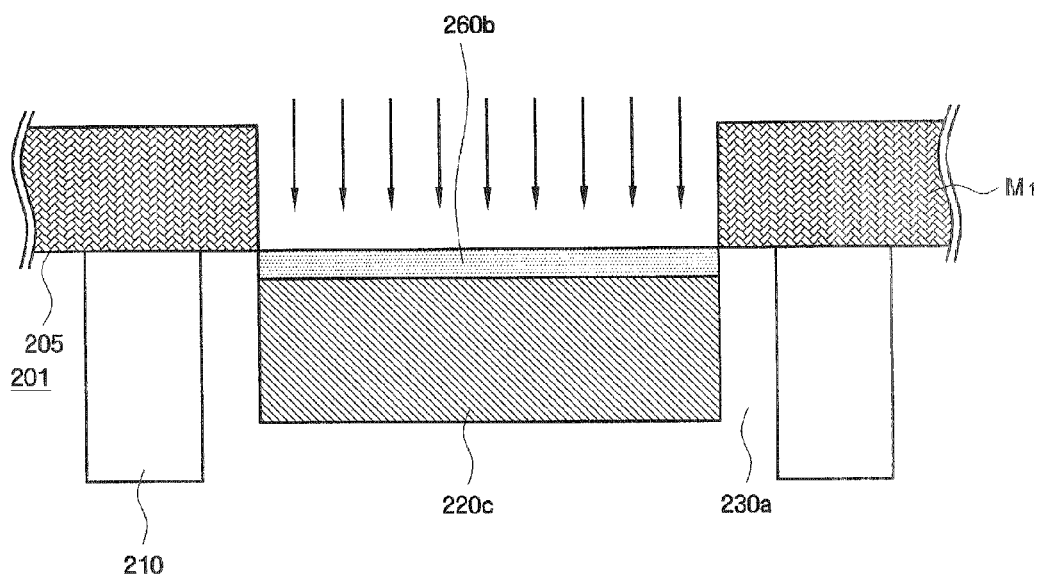

Referring to FIG. 8A, after the step of FIG. 7B, the upper impurity-doped region 260b which adjoins the surface 205 of the substrate 201 is formed. If the upper impurity-doped region 260b is formed, the impurity-doped region 220a of FIG. 7B is formed as the lower impurity-doped region 220c.

The upper impurity-doped region 260b may be, for example, an N–, P+ or P– impurity-doped region. At this time, to prevent an N+ impurity-doped region from forming adjacent to the surface 205 of the substrate 201, in the course of forming the lower impurity-doped region 220c, a large doping energy may be maintained to prevent impurities from being disposed adjacent to the surface 205 of the substrate 201.

For example, the step of FIG. 8A may form the floating diffusion region 200e of the CMOS image sensor in accordance with another exemplary embodiment of the present invention as shown in FIG. 5B.

Figure 8B:
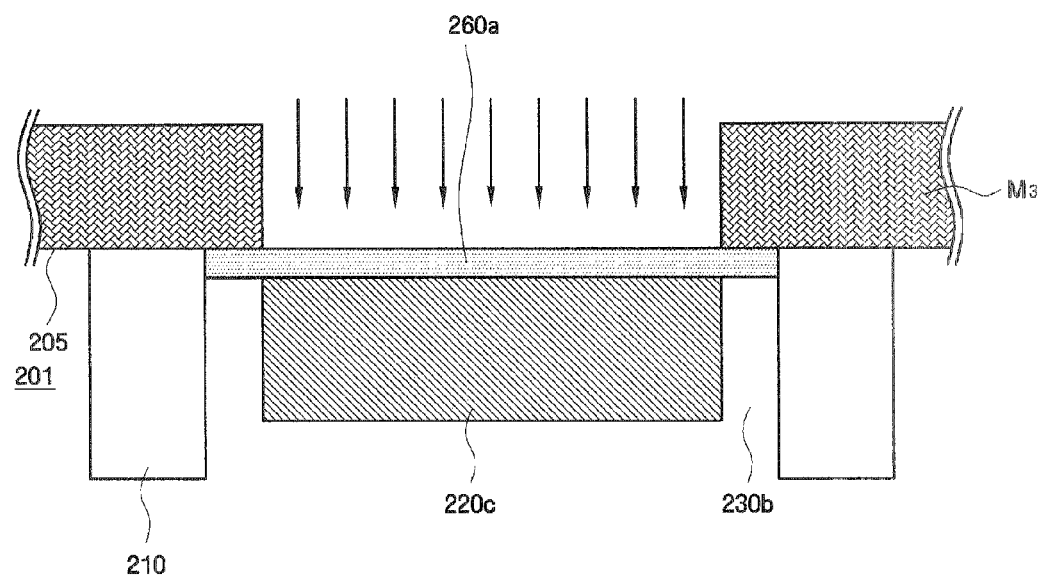

Referring to FIG. 8B, after the step of FIG. 7B, a third doping mask M3 which completely opens the space between the isolation regions 210 is formed, and then the upper impurity-doped region 260a which adjoins the surface 205 of the substrate 201 and the isolation region 210 is formed. The upper impurity-doped region 260a may be, for example, an N–, P+ or P– impurity-doped region.

For example, the step of FIG. 8B may form the floating diffusion region 200d of the CMOS image sensor in accordance with another exemplary embodiment of the present invention as shown in FIG. 4C.

Figure 8C:
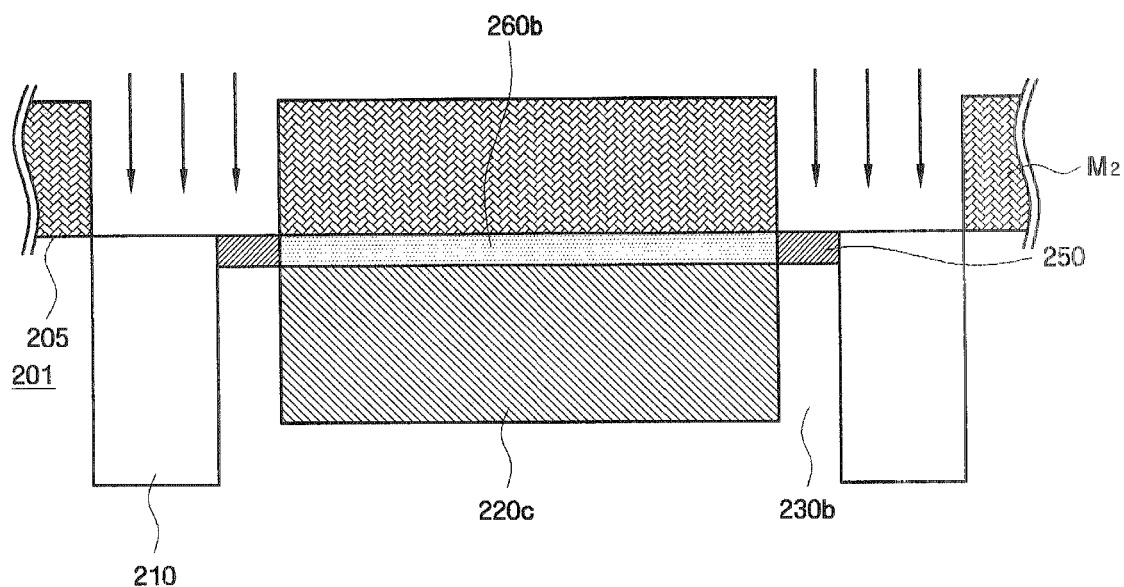

Referring to FIG. 8C, after the step of FIG. 8A or 8B, the corner impurity-doped region 250 is formed. The corner impurity-doped region may be formed to adjoin the side surface of the isolation region 210. With reference to FIG. 7C, the second doping mask M2 may be formed and then the impurity doping process may be performed.

The corner impurity-doped region 250 may be, for example, an N– or P+ impurity-doped region.

For example, FIG. 8C may form the floating diffusion region 200f of the CMOS image sensor in accordance with another exemplary embodiment of the present invention as shown in FIG. 6C.

Figure 9A:
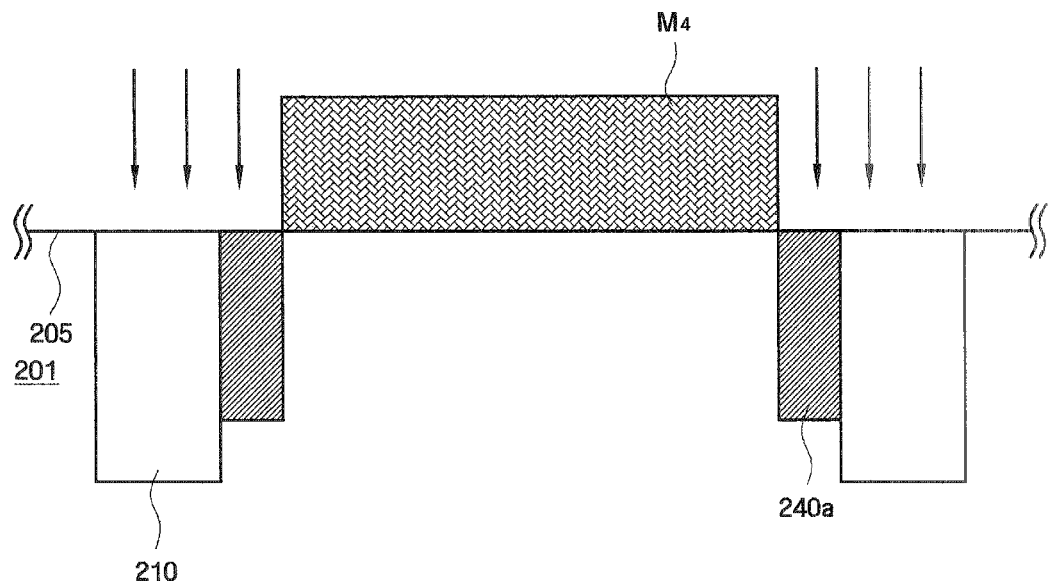

Referring to FIG. 9A, after the step of FIG. 7A, in a state in which a fourth doping mask M4 for opening the predetermined interval 240a from the side surface of the isolation region 210 is formed, an impurity doping process is conducted to form the outer impurity-doped region 240a which adjoins the side surface of the isolation region 210. The outer impurity-doped region 240a may be, for example, an N–, P+ or P– impurity-doped region.

Figure 9B:
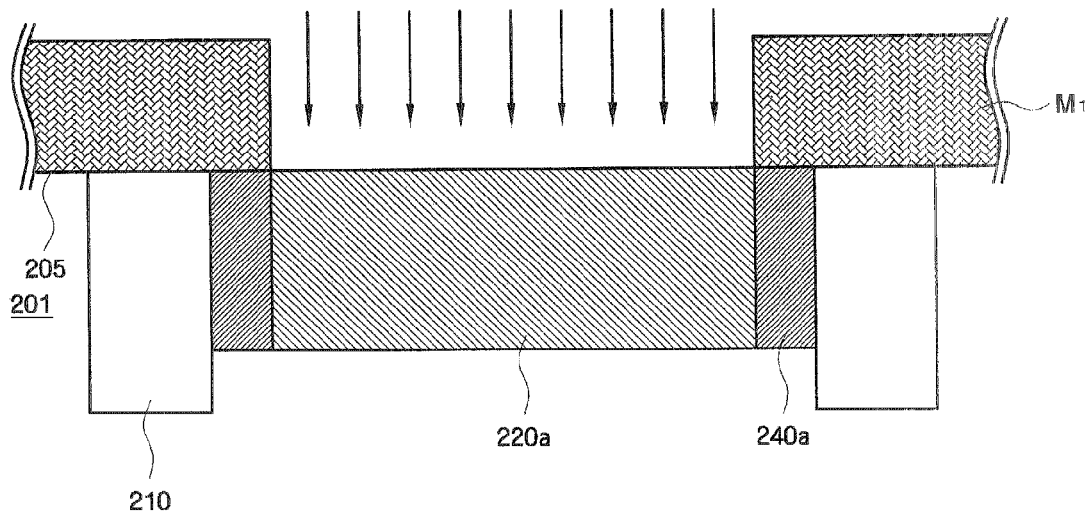

Referring to FIG. 9B, by forming the first doping mask M1 and then doping impurities with reference to FIG. 7B, the inner impurity-doped region 220a may be formed. The inner impurity-doped region 220a may be, for example, an N+ impurity-doped region.

For example, the step of FIG. 9B may form the floating diffusion region 200b of the CMOS image sensor in accordance with another exemplary embodiment of the present invention as shown in FIG. 2B.

Figure 9C:
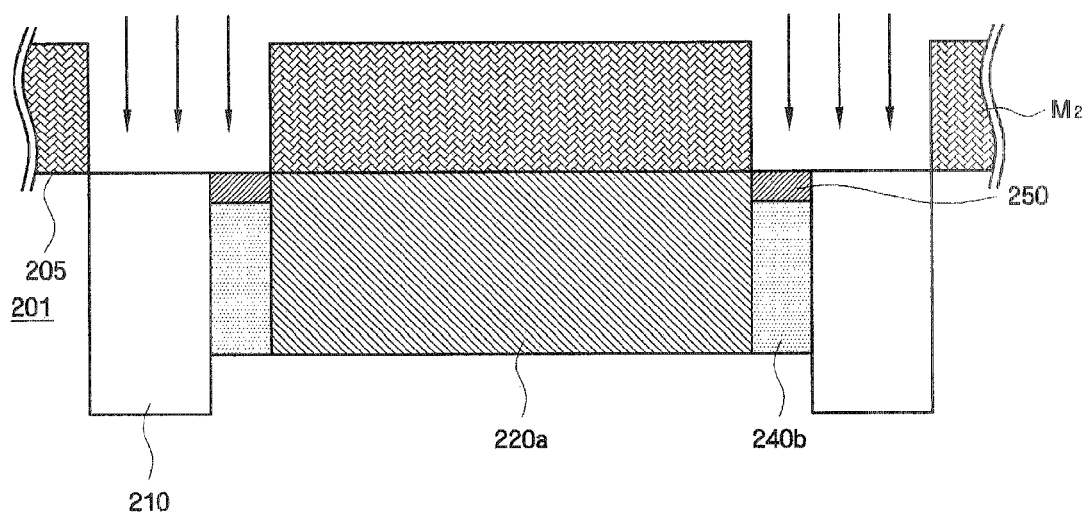

Referring to FIG. 9C, after the step of FIG. 9B, by forming the second doping mask M2 and then performing an impurity doping process, the corner impurity-doped region 250 is formed. The corner impurity-doped region 250 may be, for example, an N– or P+ impurity-doped region.

For example, the step of FIG. 9C may form the floating diffusion region 200c of the CMOS image sensor in accordance with another exemplary embodiment of the present invention as shown in FIG. 3C.

Figure 10A:
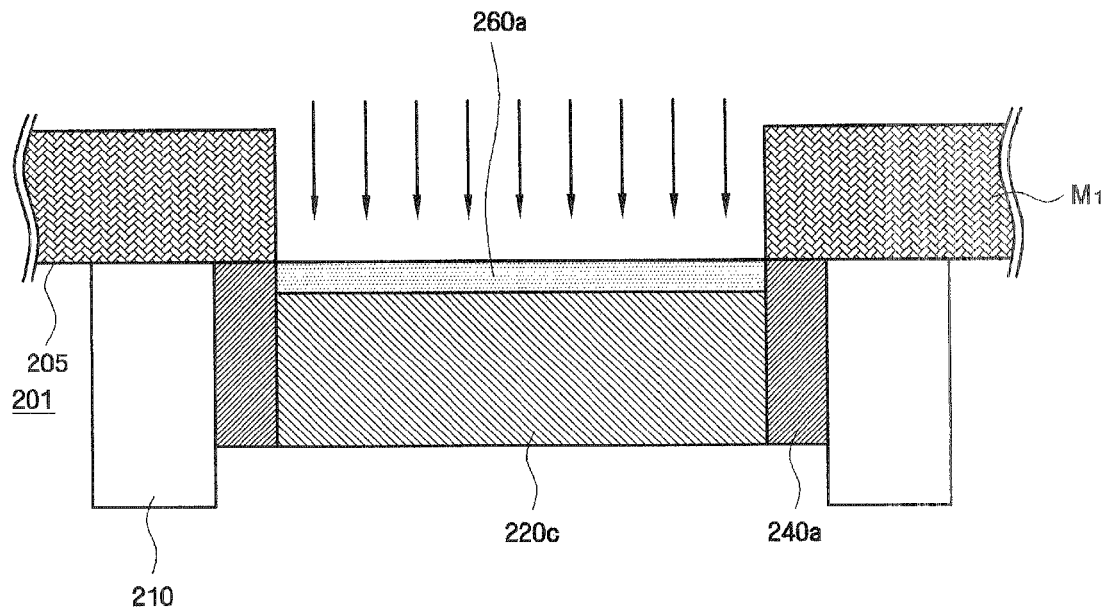

Referring to FIG. 10A, after the step of FIG. 9B, the upper impurity-doped region 260a is formed. The method of forming the upper impurity-doped region 260a of FIG. 10A may be grasped with reference to FIG. 8A. The upper impurity-doped region 260a may be, for example, an N–, P+ or P– impurity-doped region.

For example, the step of FIG. 10A may form the floating diffusion region 200d of the CMOS image sensor in accordance with another exemplary embodiment of the present invention as shown in FIG. 4D.

Figure 10B:
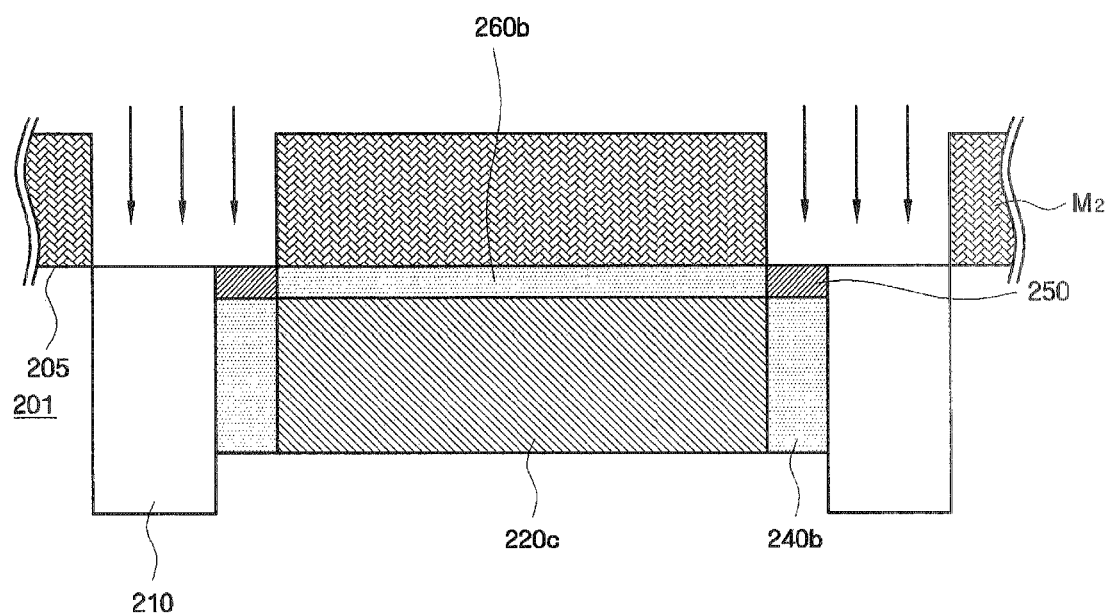

Referring to FIG. 10B, after the step of FIG. 10A, the corner impurity-doped region 250 is formed. The corner impurity-doped region 250 may be, for example, an N– or P+ impurity-doped region.

For example, the step of FIG. 10B may form the floating diffusion region 200f of the CMOS image sensor in accordance with another exemplary embodiment of the present invention, as shown in FIG. 6B.

Figure 11A:
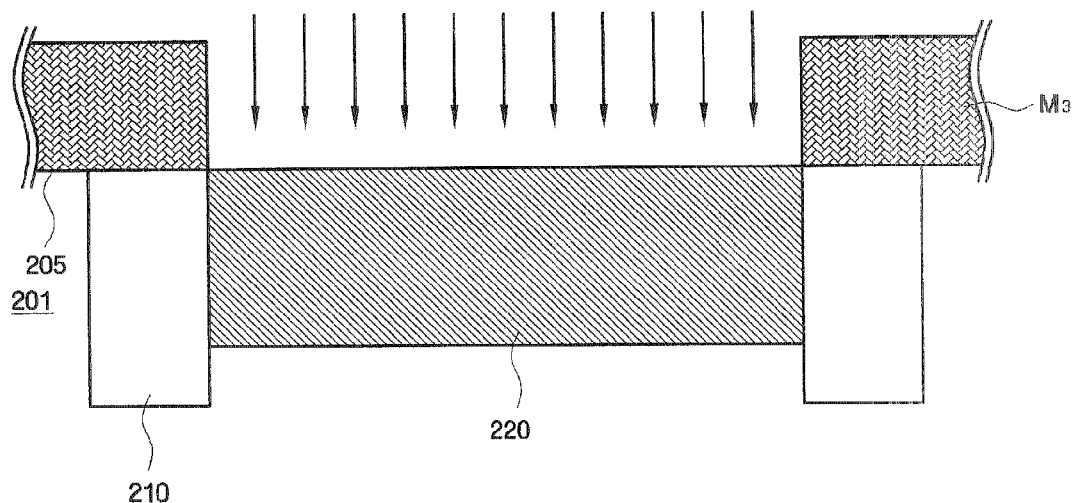

Referring to FIG. 11A, after the step of FIG. 7A, the impurity-doped region 220 which adjoins the side surfaces of the isolation regions 210 is formed. The impurity-doped region 220 may be, for example, an N+ impurity-doped region. The impurity-doped region 220 may adjoin or be separated from the surface 205 of the substrate 201. In the case where it is separated, the impurity-doped region 220 may have a depth of about 0.03 μm.

Figure 11B:
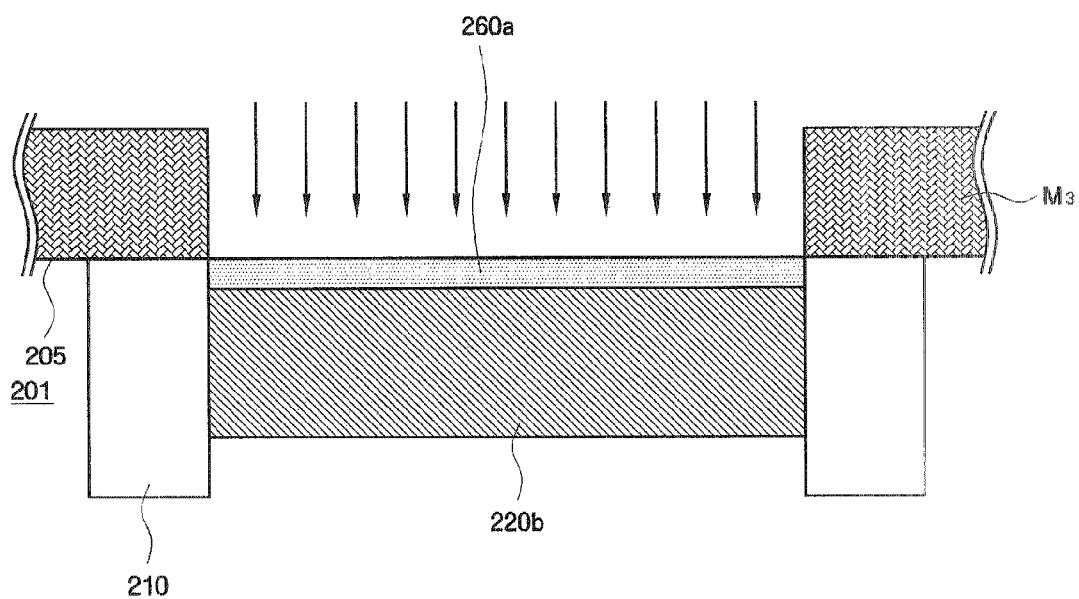

Referring to FIG. 11B, after the step of FIG. 11A, the upper impurity-doped region 260a which adjoins the surface 205 of the substrate 201 is formed. At this time, the impurity-doped region 220 may be formed as the lower impurity-doped region 220b. The upper impurity-doped region 260a may be, for example, an N–, P+ or P– impurity-doped region.

For example, the step of FIG. 11B may form the floating diffusion region 200d of the CMOS image sensor in accordance with another exemplary embodiment of the present invention as shown in FIG. 4B.

Figure 11C:
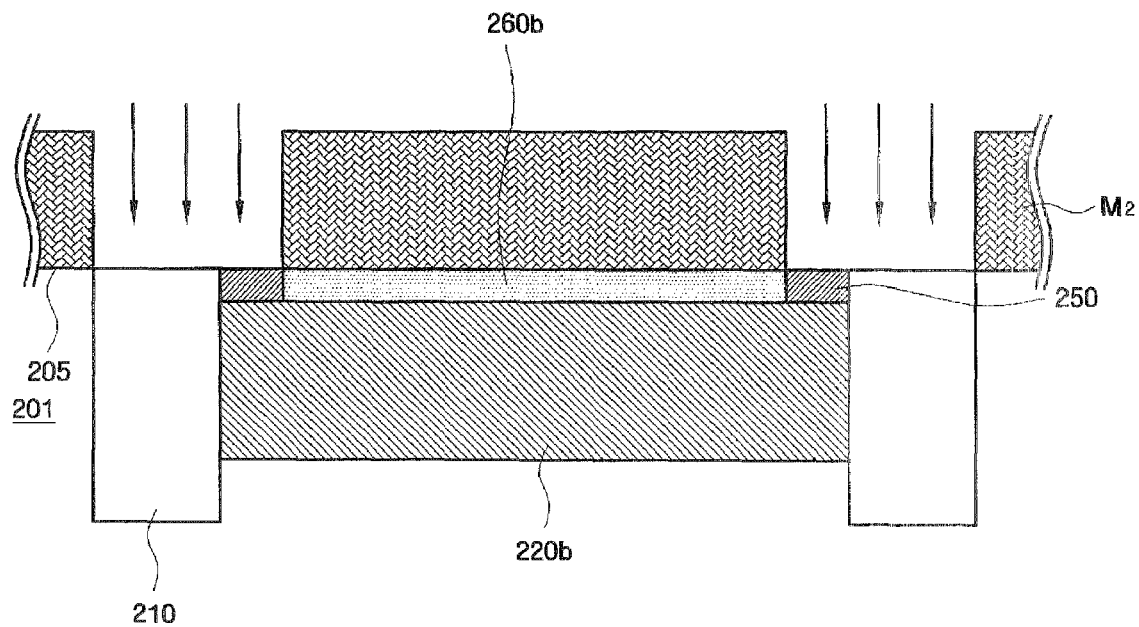

Referring to FIG. 11C, after the step of FIG. 11B, the corner impurity-doped region 250 is formed. The corner impurity-doped region 250 may be, for example, an N– or P+ impurity-doped region.

For example, the step of FIG. 11C may form the floating diffusion region 200f of the CMOS image sensor in accordance with another exemplary embodiment of the present invention as shown in FIG. 6D.

As is apparent from the above description, the CMOS image sensors in accordance with the exemplary embodiments of the present invention provide benefits in that, for example, as the dark current generated on the interface between a floating diffusion region and an STI region and on the surface of a substrate may be decreased when operating the CMOS image sensor, particularly a global shutter, it is possible to prevent the degradation of image quality and formation of a white point due to over-current.

For example, while the methods for forming the floating diffusion regions 200 of the CMOS image sensors in accordance with the exemplary embodiments of the present invention have been sequentially described, the sequences for forming the respective impurity-doped regions explained in the embodiments may not conform to the sequences shown in FIGS. 7A through 11C. As an example, the step for forming the lower impurity-doped regions 220 and the step for flank forming the impurity-doped regions 240 may be exchanged with each other. Also, the steps for forming other impurity-doped regions may be exchanged with one another. In the manufacture of a semiconductor device in accordance with exemplary embodiments of the present invention, respective impurity doping processes, for example, N+, N−, P+ and P− impurity doping processes, may be implemented in a variety of ways. This is because the respective impurity-doped regions in accordance with the exemplary embodiments of the present invention do not overlap one another but form their respective regions, and, when considering the characteristic of an impurity doping process, it is not necessary to distinguish between the concepts conveyed by the words, 'upper', 'lower', 'before' and 'after'.

Having described the exemplary embodiments of the present invention, it is further noted that it is readily apparent to those of reasonable skill in the art various modifications may be made without departing from the spirit and scope of the invention which is defined by the metes and bounds of the appended claims.

What is claimed is:

1. A complementary metal oxide semiconductor (CMOS) image sensor comprising:
    a photoelectric generation unit formed in a substrate;
    a plurality of isolation regions formed in the substrate;
    a floating diffusion region that includes an N-type first impurity-doped region that is formed between the plurality of isolation regions and is separated from a side surface of the isolation region, and a P-type upper impurity-doped region formed between the surface of the substrate and the first impurity-doped region; and
    a transfer unit that transfers electrons generated in the photoelectric generation unit to the floating diffusion region.

2. The CMOS image sensor of claim 1, wherein the region between the first impurity-doped region and the isolation region is a region where impurities have been injected into to the same dose as in the substrate.

3. The CMOS image sensor of claim 1, further comprising:
    a corner impurity-doped region formed between the isolation region and the upper impurity-doped region.

4. The CMOS image sensor of claim 1, wherein the photoelectric generation unit is a photodiode, and the transfer unit is a transistor.

5. A complementary metal oxide semiconductor (CMOS) image sensor comprising:
    a photoelectric generation unit formed in a substrate;
    a plurality of isolation regions formed in the substrate;
    a floating diffusion region that includes a first conductive-type flank impurity-doped region formed adjacent to the surface of the substrate and the plurality of isolation regions, and a first conductive-type first impurity-doped region; and
    a transfer unit that transfers electrons generated in the photoelectric generation unit to the floating diffusion region.

6. The CMOS image sensor of claim 5, wherein the first impurity-doped region is an N-type impurity-doped region, and the flank impurity-doped region is doped to a second dose which is no greater than half of the first dose.

7. The CMOS image sensor of chum 5, further comprising:
    an upper impurity-doped region formed between the surface of the substrate and the first impurity-doped region.

8. The CMOS image sensor of claim 7, wherein the first impurity-doped region is an N-type impurity-doped region doped to a first dose, and the upper impurity-doped region is doped to a second dose which is no greater than half of the first dose.

9. The CMOS image sensor of claim 7, wherein the first impurity-doped region is an N-type impurity-doped region, and the upper impurity-doped region is a P-type impurity-doped region.

10. The CMOS image sensor of claim 7, further comprising:
    a corner impurity-doped region that is adjacent to the surface of the substrate, and is formed between the upper impurity-doped region and the isolation region.

11. The CMOS image sensor of claim 5, wherein the photoelectric generation unit is a photodiode, and the transfer unit is a transistor.

12. A complementary metal oxide semiconductor (CMOS) image sensor comprising:
    a photoelectric generation unit formed in a substrate;
    a plurality of isolation regions formed in the substrate;
    a floating diffusion region that includes a first conductive-type first impurity-doped region formed adjacent to the side surface of the plurality of isolation regions, and a second conductive-type upper impurity-doped region formed between the surface of the substrate and the first impurity region; and
    a transfer unit that transfers electrons generated in the photoelectric generation unit to the floating diffusion region.

13. The CMOS image sensor of claim 12, wherein the first conductive type is N type, and the second conductive type is P type.

14. The CMOS image sensor of claim 12, further comprising:
    a corner impurity-doped region that is adjacent to the surface of the substrate, and is formed adjacent to the side surface of the upper impurity-doped region and the side surface of the isolation region.

15. The CMOS image sensor of claim 12, wherein the photoelectric generation unit is a photodiode, and the transfer unit is a transistor.

* * * * *